(12) United States Patent
Lee

(10) Patent No.: US 10,236,064 B2
(45) Date of Patent: Mar. 19, 2019

(54) SEMICONDUCTOR MEMORY DEVICE AND OPERATION METHOD THEREOF

(71) Applicant: SK hynix Inc., Icheon-si, Gyeonggi-do (KR)

(72) Inventor: Hee Youl Lee, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/922,406

(22) Filed: Mar. 15, 2018

(65) Prior Publication Data

US 2019/0051355 A1    Feb. 14, 2019

(30) Foreign Application Priority Data

Aug. 11, 2017  (KR) .................. 10-2017-0102490

(51) Int. Cl.

| G11C 16/04 | (2006.01) |
|---|---|
| G11C 16/08 | (2006.01) |
| G11C 16/12 | (2006.01) |
| G11C 11/56 | (2006.01) |
| G11C 16/34 | (2006.01) |
| G11C 16/30 | (2006.01) |

(52) U.S. Cl.
CPC .......... *G11C 16/08* (2013.01); *G11C 11/5628* (2013.01); *G11C 16/0466* (2013.01); *G11C 16/0483* (2013.01); *G11C 16/12* (2013.01); *G11C 16/30* (2013.01); *G11C 16/3404* (2013.01); *G11C 16/3459* (2013.01)

(58) Field of Classification Search
CPC ...... G11C 16/04; G11C 16/08; G11C 11/5628

USPC ...................................................... 365/185.18
See application file for complete search history.

(56) References Cited

U.S. PATENT DOCUMENTS

| 8,804,430 B2 * | 8/2014 | Lai ....................... G11C 11/5628 |
| | | 365/185.18 |
| 2014/0071761 A1* | 3/2014 | Sharon ................... G11C 16/26 |
| | | 365/185.18 |
| 2015/0262680 A1* | 9/2015 | Kobayashi ............. G11C 16/10 |
| | | 365/185.18 |
| 2015/0332781 A1* | 11/2015 | Lee ........................ G11C 16/10 |
| | | 365/185.18 |

FOREIGN PATENT DOCUMENTS

| KR | 1020150109120 A | 10/2015 |
| KR | 101666942 B1 | 10/2016 |

* cited by examiner

*Primary Examiner* — Harry W Byrne
(74) *Attorney, Agent, or Firm* — William Park & Associates Ltd.

(57) ABSTRACT

A semiconductor memory device includes a cell string and a peripheral circuit. The cell string includes a plurality of memory cells coupled between a common source line and a bit line. The peripheral circuit controls a voltage supplied to the cell string to program a selected memory cell of the cell string by performing a program loop including a program section, a detrap section, and a verify section. Also, the peripheral circuit is configured to supply a program voltage to a word line coupled to the selected memory cell among the plurality of memory cells during the program section. The peripheral circuit further supplies a detrap voltage to the cell string during the detrap section and supplies a verify voltage to the word line during the verify section.

20 Claims, 14 Drawing Sheets

SEMICONDUCTOR MEMORY DEVICE AND OPERATION METHOD THEREOF

CROSS-REFERENCE TO RELATED APPLICATION

The present application claims priority under 35 U.S.C. § 119(a) to Korean patent application number 10-2017-0102490 filed on Aug. 11, 2017, in the Korean Intellectual Property Office, the entire disclosure of which is incorporated herein by reference.

BACKGROUND

1. Technical Field

An aspect of the present disclosure relates to an electronic device, and more particularly, to a semiconductor memory device and an operation method thereof.

2. Related Art

Memory devices may be formed in a two-dimensional structure in which strings are horizontally arranged on a semiconductor substrate, or they may be formed in a three-dimensional structure in which strings are stacked vertically on a semiconductor substrate. Three-dimensional memory devices are memory devices devised to overcome a limit in the degree of integration for two-dimensional memory devices. A three-dimensional memory device may include a plurality of memory cells stacked vertically on a semiconductor substrate.

SUMMARY

In accordance with teachings presented herein is a semiconductor memory device including a cell string having a plurality of memory cells coupled between a common source line and a bit line. The semiconductor memory device also includes a peripheral circuit configured to control a voltage supplied to the cell string such that a selected memory cell of the plurality of memory cells of the cell string is programmed by performing a program loop including a program section, a detrap section, and a verify section. The peripheral circuit is also configured to supply a program voltage to a word line coupled to the selected memory cell during the program section, supply a detrap voltage to the cell string during the detrap section, and supply a verify voltage to the word line during the verify section.

Also in accordance with teachings presented herein, a method for operating a semiconductor memory device includes applying a program voltage to a word line coupled to a selected memory cell of a plurality of memory cells included in a cell string of the semiconductor memory device. The method further includes performing a detrap operation, using a detrap voltage, on the selected memory cell and performing a verify operation on the selected memory cell.

BRIEF DESCRIPTION OF THE DRAWINGS

Example embodiments are described in detail with reference to the accompanying drawings. Additional embodiments, however, can take on different forms. Therefore, possible embodiments should not be construed as being limited to descriptions or drawings presented herein.

In the drawings, dimensions may be exaggerated for clarity of illustration. It will be understood that when an element is referred to as being "between" two other elements, it can be the only element between the two elements, or one or more intervening elements may additionally be present between the two elements. Like reference numerals refer to like elements throughout the drawings.

DETAILED DESCRIPTION

Figure 1:
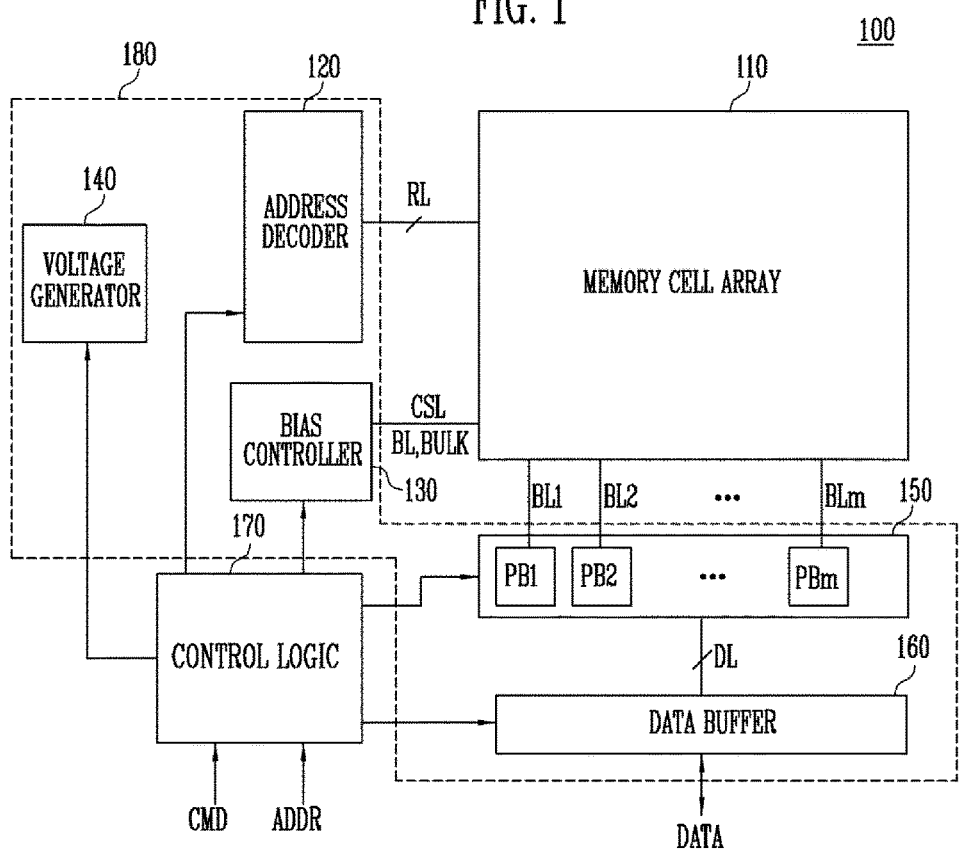
FIG. 1 shows a block diagram illustrating a semiconductor memory device according to an embodiment of the present disclosure.

In the following detailed description, only a limited number of embodiments been illustrated and described.

Those skilled in the art will realize that described embodiments may be modified in various different ways, all without departing from the spirit or scope of the present disclosure. Accordingly, the drawings and descriptions are to be regarded as being exemplary in nature without being restrictive.

In the specification, when two elements is referred to as being "connected" or "coupled" to each other, they can be directly connected or coupled to each other or be indirectly connected or coupled to each other with one or more intervening elements interposed between the two elements. An element referred to as "including" a component indicates, unless specified otherwise, that the element may further include one or more other components in addition to the component indicated.

Some embodiments presented herein are directed to semiconductor memory devices for which the reliability of a program operation is improved. Other embodiments also provide a method for performing a program operation having improved reliability on semiconductor memory devices.

In accordance with teachings presented herein is a semiconductor memory device including a cell string having a plurality of memory cells coupled between a common source line and a bit line. The semiconductor memory device also includes a peripheral circuit configured to control a voltage supplied to the cell string such that a selected memory cell of the plurality of memory cells of the cell string is programmed by performing a program loop including a program section, a detrap section, and a verify section. The peripheral circuit is also configured to supply a program voltage to a word line coupled to the selected memory cell during the program section, supply a detrap voltage to the cell string during the detrap section, and supply a verify voltage to the word line during the verify section.

For one embodiment, the peripheral circuit includes an address decoder configured to transfer the program voltage and the verify voltage to the word line coupled to the selected memory cell by decoding a row address. The peripheral circuit further includes a bias controller configured to supply, during the detrap section, the detrap voltage to increase a channel potential of the cell string to be increased. The peripheral circuit also includes a read/write circuit coupled to the bit line of the cell string, wherein the read/write circuit is configured to transfer data to be programmed to the cell string.

In a further embodiment, the bias controller of the peripheral circuit is coupled to the common source line. The bias controller supplies, during the detrap section, the detrap voltage to the common source line to increase a channel potential of the selected memory cell. For a further embodiment, during the detrap section, the address decoder of the peripheral circuit supplies a first voltage to the word line coupled to the selected memory cell, wherein the first voltage is smaller than the detrap voltage. The address decoder also supplies a detrap pass voltage to a word line coupled to an unselected memory cell of the plurality of the memory cells, wherein the detrap pass voltage is larger than the first voltage.

In another embodiment, the bias controller of the peripheral circuit is coupled to the bit line. The bias controller supplies the detrap voltage to the bit line during the detrap section to increase the channel potential of the selected memory cell. For a further embodiment, during the detrap section, the address decoder supplies a first voltage to the word line coupled to the selected memory cell, wherein wherein the first voltage is smaller than the detrap voltage. The address decoder also supplies a detrap pass voltage to a word line coupled to an unselected memory cell of the plurality of memory cells, wherein the detrap pass voltage is larger than the first voltage.

In another embodiment, the bias controller of the peripheral circuit supplies, during the detrap section to increase the channel potential of the selected memory cell, the detrap voltage to a bulk region in which the cell string is formed. In a further embodiment, the common source line coupled to the plurality of memory cells is floated and, as a potential of the bulk region is increased, holes are supplied to a channel region of the cell string so that the channel potential is increased. For an alternate embodiment, during the detrap section, the address decoder supplies a first voltage to the word line coupled to the selected memory cell and supplies a detrap pass voltage to a word line coupled to an unselected memory cell of the plurality of memory cells. In some instances, the first voltage is smaller than the detrap voltage, and the detrap pass voltage is larger than the first voltage.

For one embodiment, the detrap voltage is a voltage that results in holes being injected into the channel region of the cell string to remove electrons trapped in a tunnel insulating layer region of the selected memory cell. For another embodiment, the detrap voltage is a voltage that results in holes being injected into the channel region of the cell string to remove electrons trapped in a first region adjacent to the tunnel insulating layer in a charge storage layer region of the selected memory cell.

Also in accordance with teachings presented herein, a method for operating a semiconductor memory device includes applying a program voltage to a word line coupled to a selected memory cell of a plurality of memory cells included in a cell string of the semiconductor memory device. The method further includes performing a detrap operation, using a detrap voltage, on the selected memory cell and performing a verify operation on the selected memory cell.

In one embodiment, performing the detrap operation further includes applying the detrap voltage to the cell string to increase a potential of a channel region of the cell string. In another embodiment, performing the detrap operation further includes applying the detrap voltage to a common source line of the cell string to increase a potential of a channel region of the selected memory cell. For an additional embodiment, performing the detrap operation further includes applying the detrap voltage to a bit line coupled to the cell string to increase a potential of a channel region of the selected memory cell.

In an alternate embodiment, performing the detrap operation further includes applying the detrap voltage to a bulk region in which the cell string is formed to increase a potential of a channel region of the selected memory cell. In another embodiment, the method also includes floating a common source line of the semiconductor memory device while the detrap voltage is being applied to the bulk region and supplying holes to the channel region of the cell string as a potential of the bulk region is increased to increase a channel potential of the cell string.

In one embodiment, performing the detrap operation includes supplying a first voltage to the word line coupled to the selected memory cell, wherein the first voltage is smaller than the detrap voltage. Performing the detrap operation also includes supplying a detrap pass voltage to a word line coupled to an unselected memory cell of the plurality of memory cells, wherein the detrap pass voltage is larger than the first voltage. In a further embodiment, the detrap voltage and the first voltage are such that holes are supplied to a tunnel insulating layer region of the selected memory cell due to a difference between the detrap voltage and the first voltage. In an alternate embodiment, the detrap voltage and the detrap pass voltage are such that holes are not supplied to the tunnel insulating layer region of the selected memory cell due to a difference between the detrap voltage and the detrap pass voltage.

The word "section" is used herein to indicate an interval in time, a distinct period, or a phase of a process. Therefore, the word "section" is not restricted to a spatial interpretation, but rather includes a temporal interpretation. For example, a program section, a detrap section, and a verify section each refer to distinct phases of a program loop for programming a selected memory cell.

FIG. 1 shows a block diagram illustrating a semiconductor memory device 100 according to an embodiment of the present disclosure.

Referring to FIG. 1, the semiconductor memory device 100 includes a memory cell array 110, an address decoder 120, a bias controller 130, a voltage generator 140, a read/write circuit 150, a data buffer 160, and a control logic circuit 170.

The memory cell array 110 is shown coupled to the address decoder 120 through row lines RL. The memory cell array 110 is coupled to the read/write circuit 150 through bit lines BL1 to BLm. The memory cell array 110 includes a plurality of memory blocks. Each memory block of the plurality of memory blocks may include a plurality of cell strings. In an embodiment, the memory cell array 110 is coupled to the bias controller 130 through a common source line CSL. In another embodiment, the memory cell array 110 is coupled to the bias controller 130 through bit lines BL. For some embodiments, the bit lines BL may include the bit lines BL1 to BLm. In still another embodiment, the bias controller 130 is coupled to a bulk region BULK of a cell string in the memory cell array 110. Accordingly, the bias controller 130 is configured to transfer a voltage provided from the voltage generator 140 to at least one of the common source line CSL, the bit line BL, and the bulk region BULK of the memory cell array 110.

As illustrated in FIG. 1, the bias controller 130 is a separate component from the address decoder 120. However, in some embodiments, the bias controller 130 may be integrated or colocated with the address decoder 120. In such cases, the address decoder 120 may be configured to transfer a voltage provided from the voltage generator 140 to at least one of the common source line CSL, the bit line BL, and the bulk region BULK of the memory cell array 110.

In an embodiment, each of the plurality of cell strings may include a plurality of memory cells stacked above a substrate. The plurality of memory cells are nonvolatile memory cells. In an embodiment, each memory cell of the plurality of memory cells may be a single-level cell or a multi-level cell. The memory cell array 110 will be described in more detail with reference to FIGS. 2, 3, and 4.

The address decoder 120 is coupled to the memory cell array 110 through the row lines RL. The row lines RL include drain select lines, word lines, and source select lines. In an embodiment, the row lines RL may further include a pipe select line.

The address decoder 120 operates in response to the control of the control logic circuit 170. The address decoder 120 is configured to receive an address ADDR from the control logic circuit 170 and drive the row lines RL according to the received address ADDR.

In an embodiment, for a program operation, an address ADDR includes a block address and a row address. The address decoder 120 is configured to decode the block address in the received address ADDR. The address decoder 120 selects one memory block according to the decoded block address. The address decoder 120 also decodes the row address in the received address ADDR. The address decoder 120, according to the decoded row address, applies a program voltage and a verify voltage, which are provided from the voltage generator 140, to a selected word line of the selected memory block and applies a program pass voltage and a verify pass voltage, which are provided from the voltage generator 140, to unselected word lines of the selected memory block.

The address decoder 120 may include a block decoder, a row decoder, an address buffer, and the like.

The bias controller 130 is configured to control a bias applied to a channel region of a cell string in response to the control of the control logic circuit 170. The bias controller 130 is configured to apply a detrap voltage, that is a positive voltage applied to the cell string in a detrap section between a program section and a verify section of the memory cell array 110. As the detrap voltage is applied, the bias controller 130 may allow holes to be injected into the channel region of the cell string during the detrap section. That is, the bias controller 130 may allow holes to be injected into the channel region of the cell string by supplying a detrap voltage provided from the voltage generator 140 to the cell string during a program operation. A specific embodiment in which a detrap voltage is supplied to a cell string will be described later with reference to FIGS. 7 to 17.

The voltage generator 140 is configured to generate a plurality of voltages by using an external voltage supplied to the semiconductor memory device 100. The voltage generator 140 operates in response to the control of the control logic circuit 170.

In an embodiment, the voltage generator 140 may include a circuit that generates a power voltage by regulating an external voltage. In an embodiment, the voltage generator 140 may include a plurality of pumping capacitors and generate a plurality of voltages by selectively activating the plurality of pumping capacitors that are provided with a power voltage. The plurality of generated voltages may be provided to the address decoder 120, the bias controller 130, the read/write circuit 150, the data buffer 160, and/or the control logic circuit 170.

The read/write circuit 150 is coupled to the memory cell array 110 through the bit lines BL1 to BLm. The read/write circuit 150 operates in response to the control of the control logic circuit 170.

The read/write circuit 150 includes first to mth page buffers PB1 to PBm coupled to first to mth bit lines BL1 to BLm, respectively. During a program operation, data DATA to be programmed is input to the data buffer 160. Data arbitrarily stored in the data buffer 160 is transferred to the first to mth page buffers PB1 to PBm through data lines DL. Selected memory cells of the memory cell array 110 are programmed based on the data transferred to the first to mth page buffers PB1 to PBm.

In an embodiment, the read/write circuit 150 may further include a column selection circuit.

The data buffer 160 is coupled to the read/write circuit 150 through the data lines DL. The data buffer 160 operates in response to the control of the control logic circuit 170. The data buffer 160 may output data DATA provided from the read/write circuit 150 to the outside, for example, to a device external to the semiconductor memory device 100.

For an embodiment, and as shown in FIG. 1, the address decoder 120, the bias controller 130, the voltage generator 140, the read/write circuit 150, and the data buffer 160 may constitute a peripheral circuit 180. The peripheral 180 circuit may be configured to perform a program, a read operation, or an erase operation on the memory cell array 110 under the control of the control logic circuit 170. The peripheral 180 circuit according to an embodiment of the present disclosure may be configured to supply a program voltage to a word line coupled to a selected memory cell in the memory cell array 110 during a program section, supply a detrap voltage to a cell string during a detrap section, and/or supply a verify voltage to the word line. The detrap voltage may be a voltage that allows the potential of a channel region of the cell string to be increased. For example, as the detrap voltage is applied, a gate-induced drain leakage (GIDL) current may be generated from a source select transistor of the cell string. In another example, as the detrap voltage is applied, a GIDL current may be generated from a drain select transistor of the cell string. As holes are injected into the channel region of the cell string by the GIDL current, the channel potential of the cell string may be increased. As a further example, as the detrap voltage is applied, the potential of a bulk region in which the cell string is formed may be increased. In this case, as holes supplied from the bulk region are injected into the channel region of the cell string, the channel potential of the cell string may be increased.

The control logic circuit 170 is coupled to the address decoder 120, the bias controller 130, the voltage generator 140, the read/write circuit 150, and the data buffer 160. The control logic circuit 170 receives a command CMD and an address ADDR from the outside, for example, from a device or devices external to the semiconductor memory device 100. The control logic circuit 170 is configured to control the address decoder 120, the bias controller 130, the voltage generator 140, the read/write circuit 150, and the data buffer 160 in response to the command CMD. The control logic circuit 170 provides the address ADDR to the address decoder 120.

FIG. 1 shows one page buffer is provided for every bit line. This is illustrative of some embodiments and not intended to be limiting. In other embodiments, one page buffer may be provided for every two bit lines, and a switching unit for electrically connecting a page buffer to any one of two bit lines may be provided. For example, a semiconductor memory device having an even-odd line structure may be provided.

Figure 2:
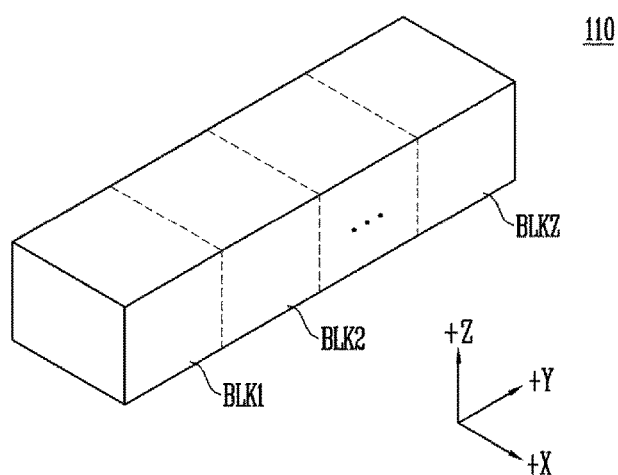
FIG. 2 shows a block diagram illustrating an embodiment of a memory cell array of FIG. 1.

FIG. 2 shows a block diagram illustrating an embodiment of the memory cell array 110 of FIG. 1.

Referring to FIG. 2, the memory cell array 110 includes a plurality of memory blocks BLK1 to BLKz. Each memory block may have a three-dimensional structure. Each memory block includes a plurality of memory cells stacked above a substrate. The plurality of memory cells are arranged along +X, +Y, and +Z directions. The structure of each memory block is described in more detail with reference to FIGS. 3 and 4.

Figure 3:
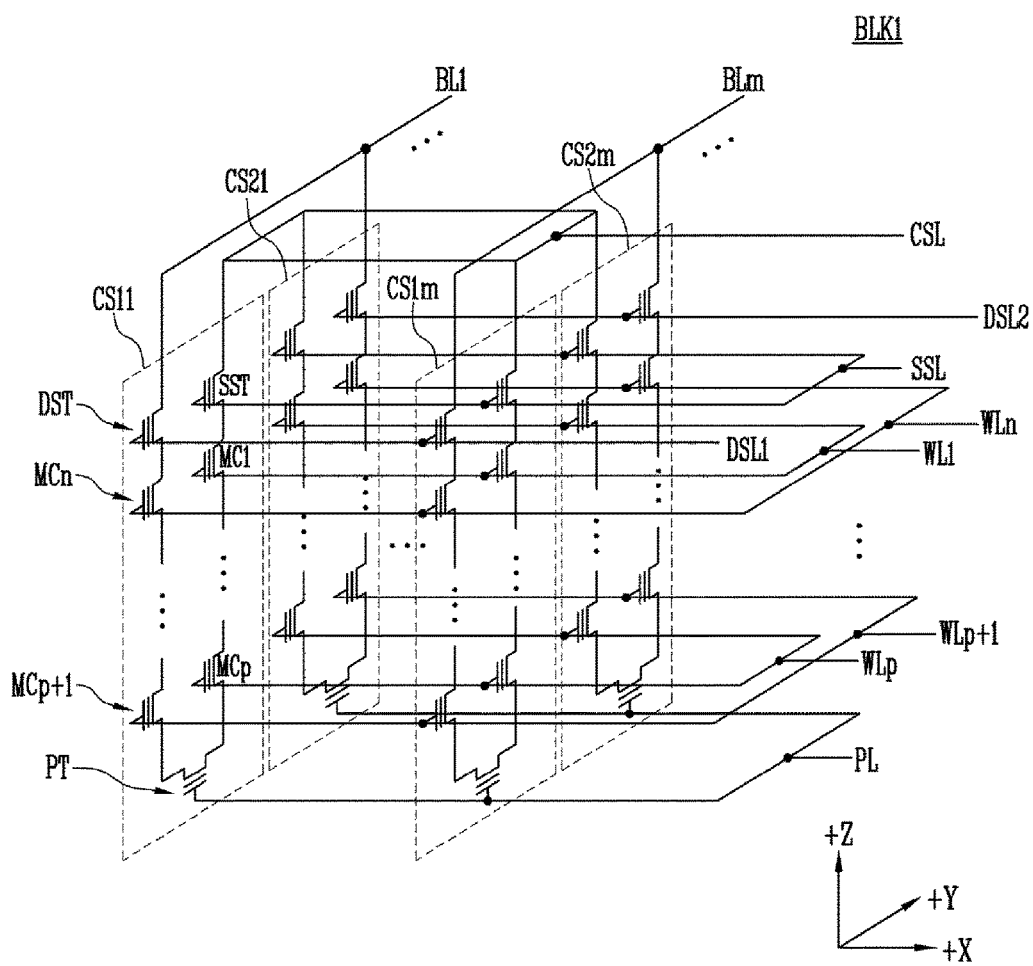
FIG. 3 shows a circuit diagram illustrating an embodiment of a memory block of FIG. 2.

FIG. 3 shows a circuit diagram illustrating an embodiment of one memory block, in this case the first memory block BLK1, of the memory blocks BLK1 to BLKz shown FIG. 2.

Referring to FIG. 3, the first memory block BLK1 includes a plurality of cell strings CS11 to CS1m and CS21 to CS2m. In the first memory block BLK1, m cell strings are arranged in a row direction (i.e., a +X direction). The m cell strings arranged in the row direction are coupled to first to mth bit lines BL1 to BLm, respectively. In addition, q (q is a natural number) cell strings are arranged in a column direction (i.e., a +Y direction). In FIG. 3, only two cell strings arranged in the column direction are illustrated for convenience of description.

Each of the plurality of cell strings CS11 to CS1m and CS21 to CS2m is formed in a 'U' shape. Each of the plurality of cell strings CS11 to CS1m and CS21 to CS2m includes a pipe transistor PT, memory cells MC1 to MCn, a source select transistor SST, and a drain select transistor DST, which are stacked above a substrate (not shown) in a lower portion of the memory block BLK1.

The select transistors SST and DST and the memory cells MC1 to MCn may have structures similar to one another. For example, each of the select transistors SST and DST and the memory cells MC1 to MCn may include a channel layer, a tunneling insulating layer, a charge storage layer, and a blocking insulating layer coupled to a corresponding row line.

The source select transistor SST of each cell string is coupled between a common source line CSL and memory cells MC1 to MCp. A gate of the source select transistor SST is commonly coupled to a source select line SSL.

The first to nth memory cells MC1 to MCn of each cell string are coupled between the source select transistor SST and the drain select transistor DST.

The first to nth memory cells MC1 to MCn are divided into first to pth memory cells MC1 to MCp and (p+1)th to nth memory cells MCp+1 to MCn. The first to pth memory cells MC1 to MCp and the (p+1)th to nth memory cells MCp+1 to MCn are coupled to each other through the pipe transistor PT. The first to pth memory cells MC1 to MCp are sequentially arranged in the opposite direction of a +Z direction and are coupled in series between the source select transistor SST and the pipe transistor PT. The (p+1)th to nth memory cells MCp+1 to MCn are sequentially arranged in the +Z direction and are coupled in series between the pipe transistor PT and the drain select transistor DST. Gates of the first to nth memory cells MC1 to MCn are coupled to first to nth word lines WL1 to WLn, respectively. Gates of the pth to (p+1)th memory cells MCp to MCp+1 are coupled to pth to (p+1)th word lines WLp to WLp+1, respectively.

A gate of the pipe transistor PT of each cell string is coupled to a pipe line PL.

The drain select transistor DST of each cell string is coupled between a corresponding bit line and the memory cells MCp+1 to MCn. The drain select transistors DST of cell strings CS11 to CS1m of a first row are coupled to a first drain select line DSL1. The drain select transistors DST of cell strings CS21 to CS2m of a second row are coupled to a second drain select line DSL2.

Consequently, cell strings (e.g., CS11 to CS1m) arranged on the same row (i.e., in the +X direction) are coupled to the same drain select line (e.g., DSL1) through corresponding drain select transistors. Cell strings (e.g., CS11 and CS21) arranged on different rows are coupled to different drain select lines DSL1 and DSL2.

Figure 4:
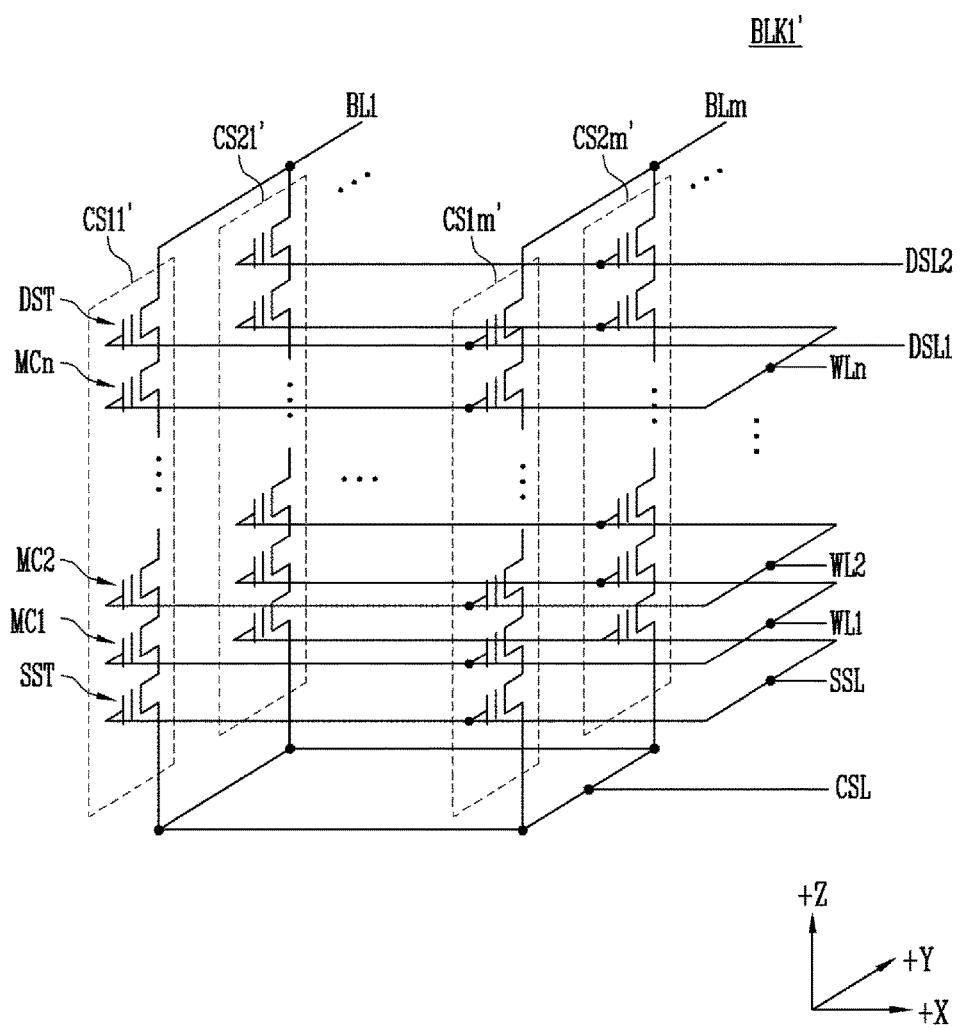
FIG. 4 shows a circuit diagram illustrating another embodiment of a memory block of FIG. 2.

FIG. 4 shows a circuit diagram illustrating another embodiment BLK1' of the first memory block BLK1 of the memory blocks BLK1 to BLKz shown in FIG. 2.

Referring to FIG. 4, the first memory block BLK1' includes a plurality of cell strings CS11' to CS1m' and CS21' to CS2m'. In the first memory block BLK1', m cell strings are arranged in a row direction (i.e., the +X direction). The m cell strings arranged in the row direction are coupled to first to mth bit lines BL1 to BLm, respectively. In addition, q (q is a natural number) cell strings are arranged in a column direction (i.e., the +Y direction). In FIG. 4, only two cell strings arranged in the column direction are illustrated for convenience of description.

Each cell string of the plurality of cell strings CS11' to CS1m' and CS21' to CS2m' extends along a +Z direction. Each of the plurality of cell strings CS11' to CS1m' and CS21' to CS2m' includes a source select transistor SST, first to nth memory cells MC1 to MCn, and a drain select transistor DST, which are stacked above a substrate (not shown) in a lower portion of the memory block BLK1'.

The source select transistor SST of each cell string is commonly coupled to a common source line CSL. The source select transistor SST of each cell string is coupled between the common source line CSL and the memory cells MC1 to MCn. A gate of the source select transistor SST of each cell string is coupled to a source select line SSL.

The first to nth memory cells MC1 to MCn of each cell string are coupled in series between the source select transistor SST and the drain select transistor DST. Memory cells arranged at the same height (e.g., same Z coordinate) are coupled to the same word line. The first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors DSTs of cell strings arranged in the same row (i.e., in the +X direction) are coupled to the same drain select line. The drain select transistors DSTs of the cell strings CS11' to CS1m' of a first row are coupled to a first drain select line DSL1. The drain select transistors DSTs of the cell strings CS21' to CS2m' of a second row are coupled to a second drain select line DSL2.

Consequently, the memory block BLK1' of FIG. 4 has a circuit similar to the circuit of the memory block BLK1 of FIG. 3, except that the pipe select transistor PT is excluded from each cell string of the circuit for the memory block BLK1'.

In FIG. 4, the first to mth cell strings CS11' to CS1m' or CS21' to CS2m' arranged in the row direction are coupled to the first to mth bit lines BL1 to BLm, respectively. In other embodiments, even bit lines and odd bit lines may be provided instead of the first to mth bit lines BL1 to BLm. In some embodiments, for the cell strings CS11' to CS1m' or CS21' to CS2m' arranged in the row direction, even-numbered cell strings may be respectively coupled to the even bit lines and odd-numbered cell strings may be respectively coupled to the odd bit lines.

Figure 5:
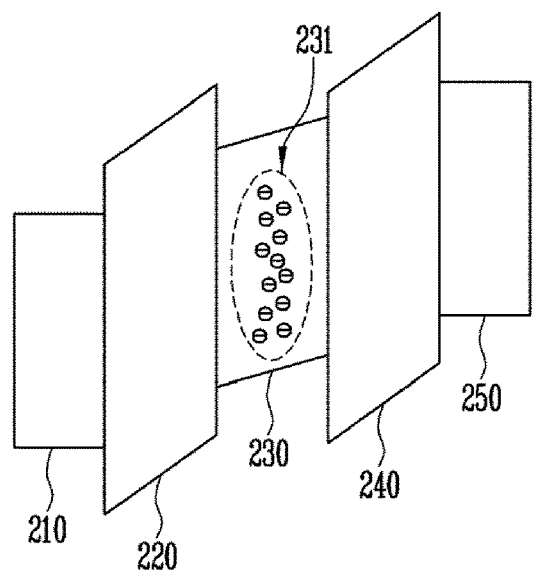
FIG. 5 shows an energy band diagram corresponding to a program operation on a memory cell being normally completed.

FIG. 5 shows an energy band diagram for when a program operation on a memory cell is normally completed.

Referring to FIG. 5, the energy band diagram illustrates a channel region 210, a tunnel insulating layer region 220, a charge storage layer region 230, a gate insulating layer region 240, and a gate region 250. If a high-voltage program voltage is applied to the gate region 250 during a program operation, electrons of the channel region 210 enter into the charge storage layer region 230 by passing through the tunnel insulating layer region 220. If the program operation is normally completed, the electrons passing through the tunnel insulating layer region 220 are located in a region 231. Accordingly, the threshold voltage of a transistor constituting the programmed memory cell is maintained.

Figure 6:
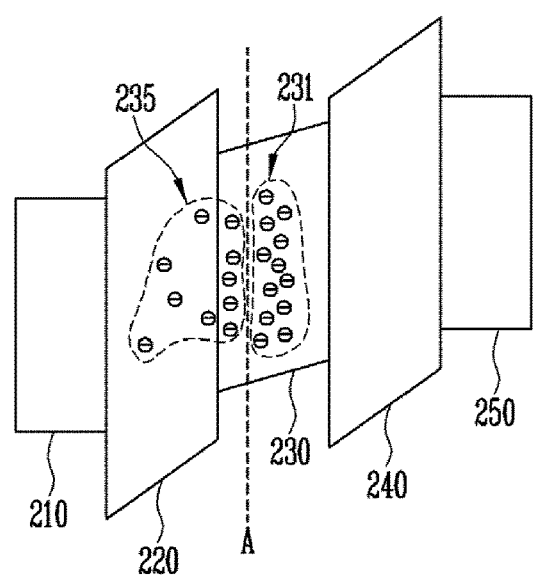
FIG. 6 shows an energy band diagram corresponding to a program operation not being normally performed on a memory cell.

FIG. 6 shows an energy band diagram for when a program operation is not normally performed on a memory cell.

Referring to FIG. 6, similarly to FIG. 5, the energy band diagram illustrates a channel region 210, a tunnel insulating layer region 220, a charge storage layer region 230, a gate insulating layer region 240, and a gate region 250. If a high-voltage program voltage is applied to the gate region 250 during a program operation, electrons of the channel region 210 enter into the charge storage layer region 230 by passing through the tunnel insulating layer region 220. Referring to FIG. 6, after the program operation, there may exist electrons that do not fully pass through the tunnel insulating layer region 220. In addition to electrons located in a stable region 231 of the charge storage layer region 230, there may exist electrons that are shallowly trapped in a region close to an interface between the charge storage layer region 230 and the tunnel insulating layer region 220. That is, electrons may exist in a region 235 located on the left side (as shown) of a boundary A.

The electrons in the region 235 allow the threshold voltage of a transistor constituting the memory cell to be increased during a verify section. Because the electrons of the region 235 are not electrons that are stably trapped, the electrons may get out into the channel region 210 as other operations are performed on the memory cell array after the program operation is completed. In this case, the threshold voltage of the transistor constituting the memory cell is decreased. That is, if the electrons of the region 235 get out into the channel region 210 after the program operation is completed, the threshold voltage is decreased, and therefore, a threshold voltage distribution may be degraded. Accordingly, if the electrons of region 235 are removed in advance before the verify section, it is possible to prevent the threshold voltage distribution from being degraded.

Figure 7:
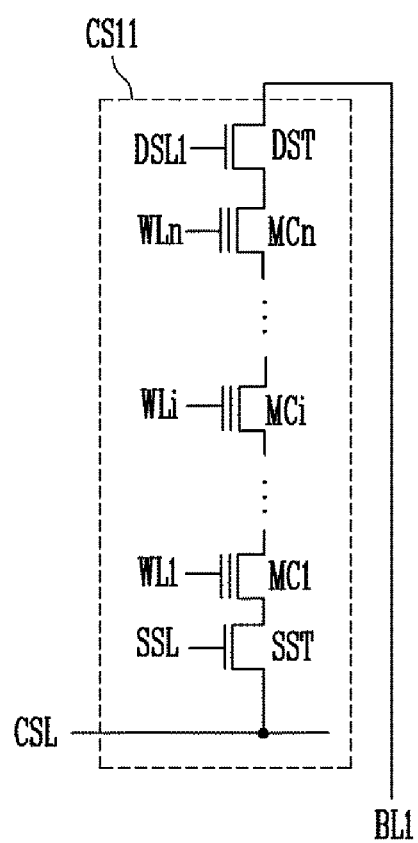
FIG. 7 shows a diagram illustrating a cell string shown in FIG. 3.

FIG. 7 shows a diagram illustrating one of the cell strings shown in FIG. 3.

In FIG. 7, only a selected cell string CS11 of the cell strings CS11 and CS21 is illustrated for convenience of description. It is assumed that an ith memory cell MCi is programmed in FIG. 7. That is, during a program section, a program pass voltage is applied to first to (i−1)th word lines WL1 to WLi−1 and (i+1)th to nth word lines WLi+1 to WLn, and a program voltage is applied to an ith word line WLi.

Figure 8:
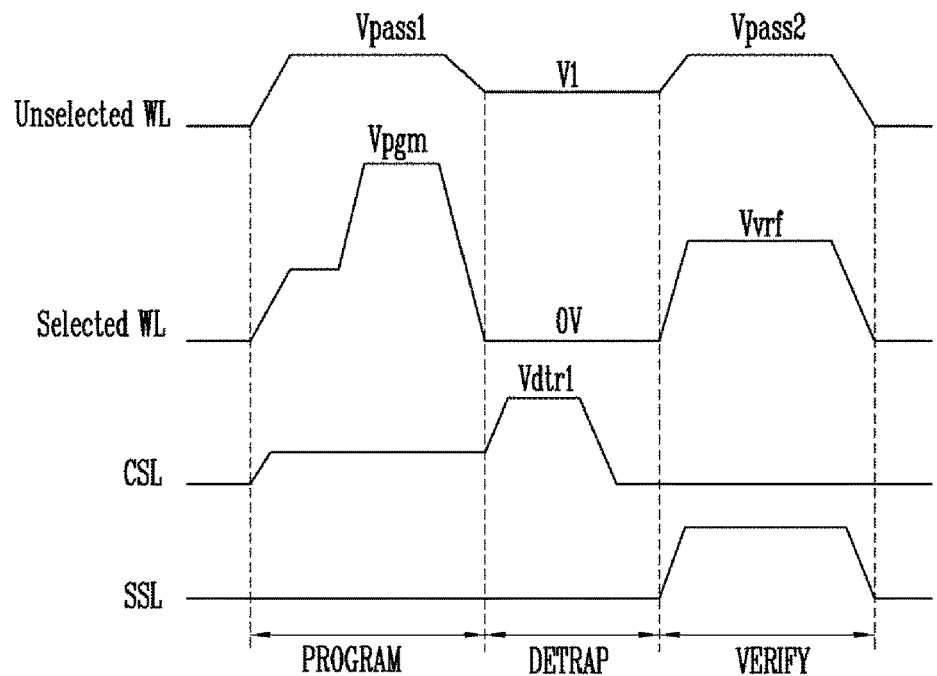
FIG. 8 shows a timing diagram illustrating an operation method of a semiconductor memory device according to an embodiment of the present disclosure.

FIG. 8 shows a timing diagram illustrating an embodiment of an operation method of the semiconductor memory device 100 according to the present disclosure.

Referring to FIG. 8, the operation method of the semiconductor memory device 100 according to an embodiment of the present disclosure includes a program section PROGRAM, a detrap section DETRAP, and a verify section VERIFY. The program section PROGRAM, the detrap section DETRAP, and the verify section VERIFY constitute one program loop, and a program operation is performed on a selected memory cell of a cell string as the program loop is repeatedly performed.

During the program section PROGRAM, the address decoder 120 supplies a program voltage (Vpgm of FIG. 8) output from the voltage generator 140 to a selected word line WLi (selected WL as illustrated) among the plurality of word lines WL1 to WLn in response to row addresses, supplies a program pass voltage (Vpass1 of FIG. 8) to the first to (i−1)th word lines WL1 to WLi−1 and the (i+1)th to nth word lines WLi+1 to WLn (unselected WL as illustrated), and supplies a power voltage to the drain select line DSL coupled to the gate of the drain select transistor DST. At this time, a ground voltage is supplied to the source select line SSL coupled to the gate of the source select transistor SST. Meanwhile, during the program section PROGRAM, the ground voltage may be provided to the common source line CSL. Alternatively, as shown in FIG. 8, a voltage slightly higher than the ground voltage may be applied to the common source line CSL. This is provided to reduce a rapid voltage increase when a detrap voltage Vdtr1 is applied to the common source line during the detrap section DETRAP. Meanwhile, the ground voltage may be supplied to the bulk region BULK.

In the program section PROGRAM, any one of a positive voltage and the ground voltage may be supplied to the bit line BL1 of the cell string CS11. For example, the positive voltage may be a power voltage. When the selected memory cell MCi is programmed to a target program state so as to store data, the ground voltage is supplied to the bit line BL1. When the selected memory cell MCi is in an erase state or when it is verified that the selected memory cell MCi has been successfully programmed in a target program state in a previous verify operation, the positive voltage (e.g., a power voltage VDD) is supplied to the bit line BL1. When the positive voltage is supplied to the bit line BL1, the bit line BL1 may be in an inhibit state.

In the semiconductor memory device 100, when data is programmed in the selected memory cell MCi, the data may be programmed using an incremental step pulse programming (ISPP) scheme. That is, a program operation, a detrap operation, and a verify operation, which are shown in FIG. 8, may be repeatedly performed until the selected memory cell MCi is successfully programmed to a target program state (or until the selected memory cell MCi is programmed up to a fixed number of times).

Figure 9:
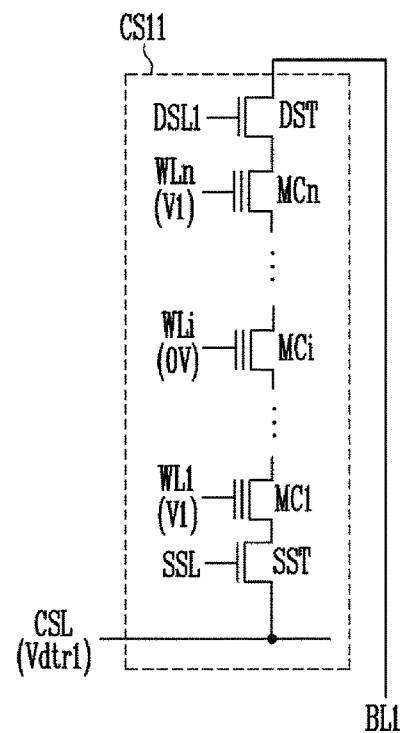
FIG. 9 shows a diagram illustrating voltages supplied to the cell string shown in FIG. 7 according to the operation method shown in FIG. 8.

FIG. 9 is a diagram illustrating voltages supplied to the cell string of FIG. 7 according to the operation method shown in FIG. 8. That is, FIG. 9 illustrates voltages supplied to the cell string CS11 during the detrap section DETRAP of FIG. 8.

Referring together to FIGS. 8 and 9, during the detrap section DETRAP, a detrap voltage is applied to the cell string CS11. To this end, the bias controller 130 shown in FIG. 1 applies the detrap voltage to the cell string CS11 including the memory cell MCi. More specifically, in an embodiment represented by FIG. 8, the detrap voltage Vdtr1 is applied to the common source line CSL of the cell string CS11. Meanwhile, as the detrap voltage Vdtr1 having a positive voltage value is applied to the common source line CSL during the detrap section DETRAP, a current caused by a gate-induced drain leakage (GIDL) phenomenon is generated in the channel region of the source select transistor SST of the cell string CS11. Accordingly, holes are injected into the channel region of the cell string CS11. Subsequently, the potential of the channel region of the cell string CS11 is increased. In particular, the channel potential of the selected memory cell MCi is increased.

Meanwhile, in an embodiment, a ground voltage, i.e., a voltage of 0V, may be applied to the word line WLi coupled to the selected memory cell MCi during the detrap section DETRAP. The ground voltage (0V) applied to the word line WLi coupled to the selected memory cell MCi is illustrative of an embodiment. That is, other voltages may be applied to the word line WLi coupled to the selected memory cell MCi in different embodiments. The electrons of the region 235 (see FIG. 6) of the selected memory cell MCi may be removed due to a difference in potential between the channel region of the selected memory cell MCi and the word line WLi coupled to the selected memory cell MCi. Specifically, holes injected into the channel region by the GIDL current may be injected into the region 235 of the selected memory cell MCi by the GIDL current. That is, the voltage applied to the word line WLi of the selected memory cell MCi during the detrap section DETRAP may be variously determined, if necessary. As the voltage applied to the word line WLi becomes smaller, a larger number of electrons may be trapped in the region 235 of FIG. 6. However, when the voltage applied to the word line WLi is excessively small, even the electrons trapped in the region 231 of FIG. 6 are detrapped, and therefore, a program period may be increased. When the voltage applied to the word line WLi is excessively large, the difference in potential between the word line WLi and the channel region is decreased, and therefore, the detrapping of the electrons trapped in the region 231 of FIG. 6 is not performed well.

In order to inject holes injected into the channel region into the region 235 of FIG. 6, the voltage applied to the word line WLi of the selected memory cell MCi has a voltage smaller than the detrap voltage Vdtr1. Meanwhile, the ground voltage may be applied to the source select line SSL during the detrap section DETRAP.

Figure 10:
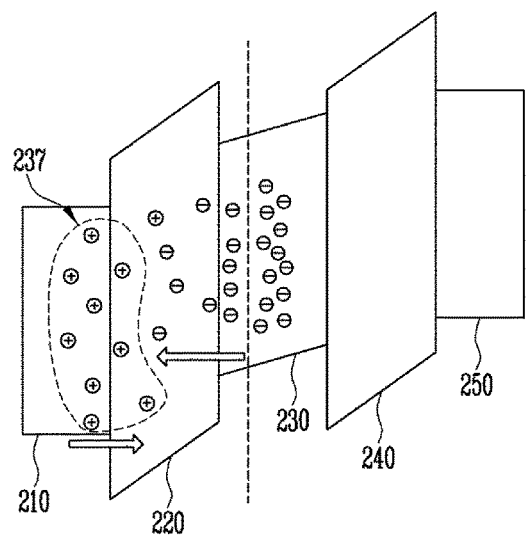
FIG. 10 shows an energy band diagram illustrating a detrapping effect caused by the operation method shown in FIG. 8.

FIG. 10 is an energy band diagram illustrating a detrapping effect caused by an operation of FIG. 8.

Referring together to FIGS. 8, 9, and 10, as the detrap voltage Vdtr1 is applied to the common source line CSL during the detrap section DETRAP, holes are injected into the channel region of the cell string CS11, and therefore, the channel potential is increased. Because the ground voltage is applied to the word line WLi coupled to the selected memory cell MCi, some 237 of the holes injected into the channel region of the cell string CS11 are injected in the direction of the tunnel insulating layer region 220 from the channel region 210. Because the holes are injected into the tunnel insulating layer region 220, electrons existing in the tunnel insulating layer region 220 or electrons shallowly trapped in the charge storage layer region 230 are removed. Accordingly, it is possible to reduce a threshold voltage drop phenomenon after the program operation is completed. As a result, the program reliability of the semiconductor memory device can be improved.

The detrap operation is not performed on the memory cells MC1 to MCi−1 and MCi+1 to MCn, only on the selected memory cell MCi being programmed. Therefore, in an embodiment, a detrap pass voltage V1 higher than the ground voltage (0V) is applied to the word lines WL1 to WLi−1 and WLi+1 to WLn coupled to gate terminals of the unselected memory cells MC1 to MCi−1 and MCi+1 to MCn during the detrap section DETRAP. The detrap pass voltage V1 is a voltage selected so that detrap does not occur in the unselected memory cells MC1 to MCi−1 and MCi+1 to MCn. That is, since the detrap pass voltage V1 has a voltage value higher than that of the voltage applied to the word line WLi, the holes injected into the channel region have no influence on threshold voltages of the unselected memory cells MC1 to MCi−1 and MCi+1 to MCn. To this end, the detrap pass voltage V1 applied to the unselected memory cells MC1 to MCi−1 and MCi+1 to MCn during the detrap section DETRAP is larger than the voltage (e.g., the ground voltage) applied to the selected word line WLi. In another embodiment, the word lines WL1 to WLi−1 and WLi+1 to WLn coupled to the gate terminals of the unselected memory cells MC1 to MCi−1 and MCi+1 to MCn may be floated during the detrap section DETRAP.

In the verify section VERIFY, a verify voltage Vvrf is applied to the word line WLi coupled to the selected memory cell MCi so as to determine whether the threshold voltage of the selected memory cell MCi has been increased to a target state. Meanwhile, a verify pass voltage Vpass2 may be applied to the word lines WL1 to WLi−1 and WLi+1 to WLn coupled to the unselected memory cells MC1 to MCi−1 and MCi+1 to MCn. Meanwhile, as the ground voltage is applied to the common source line CSL and the power voltage is applied to the source select line SSL and the drain select line DSL1, the source select transistor SST and the drain select transistor DST may be turned on. Accordingly, a program state of the selected memory cell MCi is detected by the page buffer. When the threshold voltage of the selected memory cell MCi is higher than the verify voltage Vvrf, the program operation may be completed. When the threshold voltage of the selected memory cell MCi is lower than the verify voltage Vvrf, the program loop including the program section PROGRAM, the detrap section DETRAP, and the verify section VERIFY is repeated.

As described above, for the semiconductor memory device 100 according to an embodiment of the present disclosure, as the detrap section DETRAP is provided between the program section PROGRAM and the verify section VERIFY, the injection of holes, caused by the GIDL phenomenon, occurs in the channel region of the cell string during the detrap section DETRAP. Accordingly, the channel potential of the cell string is increased, and some of electrons shallowly trapped in the selected memory cell are detrapped. More specifically, according to an embodiment represented by FIGS. 8 and 9, the bias controller 130 allows the voltage of the common source line CSL of the cell string CS11 to be increased so that the injection of holes occurs in the channel region adjacent to the source select transistor SST of the cell string CS11. Accordingly, the potential of the channel region is increased, and some of the holes injected into the channel region are injected into the tunnel insulating layer region of the selected memory cell MCi. Thus, as electrons remaining in the tunnel insulating region of the selected memory cell MCi or electrons shallowly trapped in the charge storage layer region are removed, a change in the threshold voltage of the selected memory cell MCi is minimized after the program operation is completed. As a result, the operational reliability of the semiconductor memory device 100 is improved.

Figure 11:
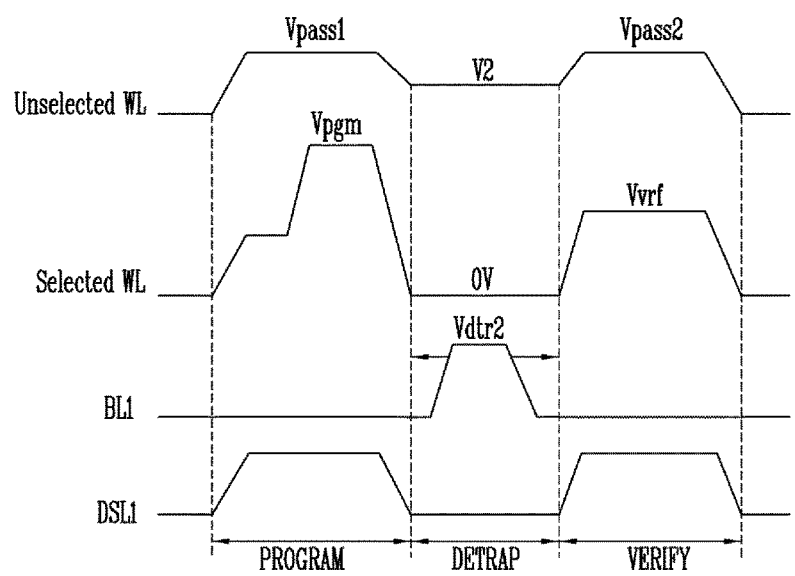
FIG. 11 shows a timing diagram illustrating an operation method of a semiconductor memory device according to an embodiment of the present disclosure.
Figure 12:
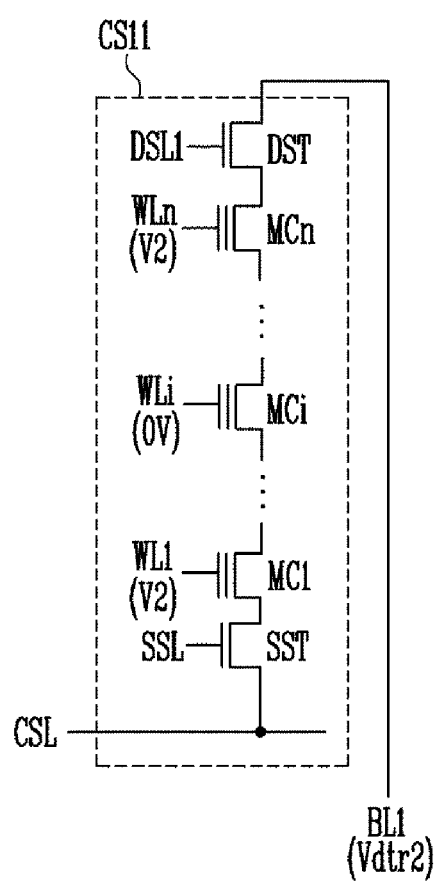
FIG. 12 shows a diagram illustrating voltages supplied to the cell string shown in FIG. 7 according to the operation method shown in FIG. 11.

FIG. 11 shows a timing diagram illustrating another embodiment of the operation method of the semiconductor memory device 100 according to an embodiment of the present disclosure. FIG. 12 shows a diagram illustrating voltages supplied to the cell string CS11 of FIG. 7 according to the operation method shown in FIG. 11.

Referring together to FIGS. 11 and 12, the ground voltage is supplied to the bit line BL1 to store data during the program section PROGRAM. Meanwhile, the program voltage Vpgm is supplied to the word line WLi (selected WL as illustrated) coupled to the selected memory cell MCi, and the program pass voltage Vpass1 is supplied to the word lines WL1 to WLi−1 and WLi+1 to WLn (unselected WL as illustrated) coupled to the unselected memory cells MC1 to MCi−1 and MCi+1 to MCn. In addition, the ground voltage may be provided to the common source line CSL, and the drain select transistor DST may be turned on as the power voltage is provided to the drain select line DSL1. The operation of the program section PROGRAM shown in FIG. 11 is similar to that of the program section PROGRAM shown in FIG. 8.

During the detrap section DETRAP, the detrap voltage is applied to the cell string CS11. To this end, the bias controller 130 shown in FIG. 1 applies a detrap voltage to the cell string CS11 including the memory cell MCi. More specifically, in an embodiment represented by FIG. 11, a detrap voltage Vdtr2 is applied to the bit line BL1 coupled to the cell string CS11. The detrap voltage Vdtr2 may be applied throughout the entire detrap section DETRAP, or it may only be applied during a partial duration of the detrap section DETRAP. As the detrap voltage Vdtr2 is applied to the bit line BL1, a current caused by the GIDL phenomenon is generated in the channel region of the drain select transistor DST of the cell string CS11. Accordingly, holes are injected into the channel region of the cell string CS11. Subsequently, the potential of the channel region of the cell string is increased. In particular, the channel potential of the selected memory cell MCi is increased.

For an embodiment, a ground voltage, i.e., a voltage of 0V, may be applied to the word line WLi coupled to the selected memory cell MCi during the detrap section DETRAP. The ground voltage (0V) applied to the word line WLi coupled to the selected memory cell MCi is illustrative of some embodiments. That is, other voltages may be applied to the word line WLi coupled to the selected memory cell MCi in different embodiments. The electrons of the region 235 (see FIG. 6) of the selected memory cell MCi may be removed due to a difference in potential between the channel region of the selected memory cell MCi and the word line WLi coupled to the selected memory cell MCi. Specifically, holes injected into the channel region by the GIDL current may be injected into the region 235 of the selected memory cell MCi by the GIDL current. The voltage applied to the word line WLi of the selected memory cell MCi during the detrap section DETRAP may take on various values, if necessary. As the voltage applied to the word line WLi becomes smaller, a larger number of electrons may be trapped in the region 235 of FIG. 6. However, when the voltage applied to the word line WLi is excessively small, even the electrons trapped in the region 231 of FIG. 6 are detrapped, and therefore, a program period may be increased. When the voltage applied to the word line WLi is excessively large, the difference in potential between the word line WLi and the channel region is decreased, and therefore, the detrapping of the electrons trapped in the region 231 of FIG. 6 is not performed well.

In order to inject holes injected into the channel region into the region 235 of FIG. 6, the voltage applied to the word line WLi of the selected memory cell MCi has a voltage smaller than the detrap voltage Vdtr2. Meanwhile, the ground voltage may be applied to the source select line SSL and the drain select line DSL1 during the detrap section DETRAP.

According to the detrap operation of the detrap section DETRAP shown in FIGS. 11 and 12, a detrapping effect occurs as shown in FIG. 10. As the detrap voltage Vdtr2 is applied to the bit line BL1 during the detrap section DETRAP, holes are injected into the channel region of the cell string CS11 by a GIDL current generated by the drain select transistor DST of the cell string CS11. Accordingly, the channel potential is increased. Because the ground voltage is applied to the word line WLi coupled to the selected memory cell MCi, there occurs a difference in potential between the channel region and the word line WLi. Accordingly, some 237 of the holes injected into the channel region of the cell string CS11 are injected in the direction of the tunnel insulating layer region 220 from the channel region 210. Because the holes are injected into the tunnel insulating layer region 220, electrons existing in the tunnel insulating layer region 220 or electrons shallowly trapped in the charge storage layer region 230 are removed. Accordingly, it is possible to reduce a threshold voltage drop phenomenon after the program operation is completed, and the program reliability of the semiconductor memory device can be improved.

The detrap operation is not performed on the memory cells MC1 to MCi−1 and MCi+1 to MCn, only on the selected memory cell MCi being programmed. Therefore, in an embodiment, a detrap pass voltage V2 higher than the ground voltage (0V) is applied to the word lines WL1 to WLi−1 and WLi+1 to WLn coupled to gate terminals of the unselected memory cells MC1 to MCi−1 and MCi+1 to MCn during the detrap section DETRAP. The detrap pass voltage V2 is a voltage selected so that detrap does not occur in the unselected memory cells MC1 to MCi−1 and MCi+1 to MCn. That is, since the detrap pass voltage V2 has a voltage value higher than that of the voltage applied to the word line WLi, the holes injected into the channel region have no influence on threshold voltages of the unselected memory cells MC1 to MCi−1 and MCi+1 to MCn. To this end, the detrap pass voltage V2 applied to the unselected memory cells MC1 to MCi−1 and MCi+1 to MCn during the detrap section DETRAP is larger than the voltage (e.g., the ground voltage) applied to the selected word line WLi. In another embodiment, the word lines WL1 to WLi−1 and WLi+1 to WLn coupled to the gate terminals of the unselected memory cells MC1 to MCi−1 and MCi+1 to MCn may be floated during the detrap section DETRAP.

In the verify section VERIFY, a verify voltage Vvrf is applied to the word line WLi coupled to the selected memory cell MCi to determine if the threshold voltage of the selected memory cell MCi has been increased to a target state. The operation of the cell string CS11 during the verify section VERIFY is identical to that described with reference to FIGS. 8 and 9. Therefore, the description will not be repeated here.

As described above, for the semiconductor memory device 100 according to an embodiment of the present disclosure, as the detrap section DETRAP is provided between the program section PROGRAM and the verify section VERIFY, the injection of holes, caused by the GIDL phenomenon, occurs in the channel region of the cell string during the detrap section DETRAP. More specifically, according to an embodiment represented by FIGS. 11 and 12, the bias controller 130 allows the voltage of the bit line BL1 coupled to the cell string CS11 to be increased so that the injection of holes occurs in the channel region adjacent to the drain select transistor DST of the cell string CS11. Accordingly, some of holes generated in the channel region are injected into the tunnel insulating layer region of the selected memory cell MCi. Thus, as electrons remaining in the tunnel insulating region of the selected memory cell MCi or electrons shallowly trapped in the charge storage layer region are removed, a change in the threshold voltage of the selected memory cell MCi is minimized after the program operation is completed. As a result, the operational reliability of the semiconductor memory device 100 is improved.

Figure 13:
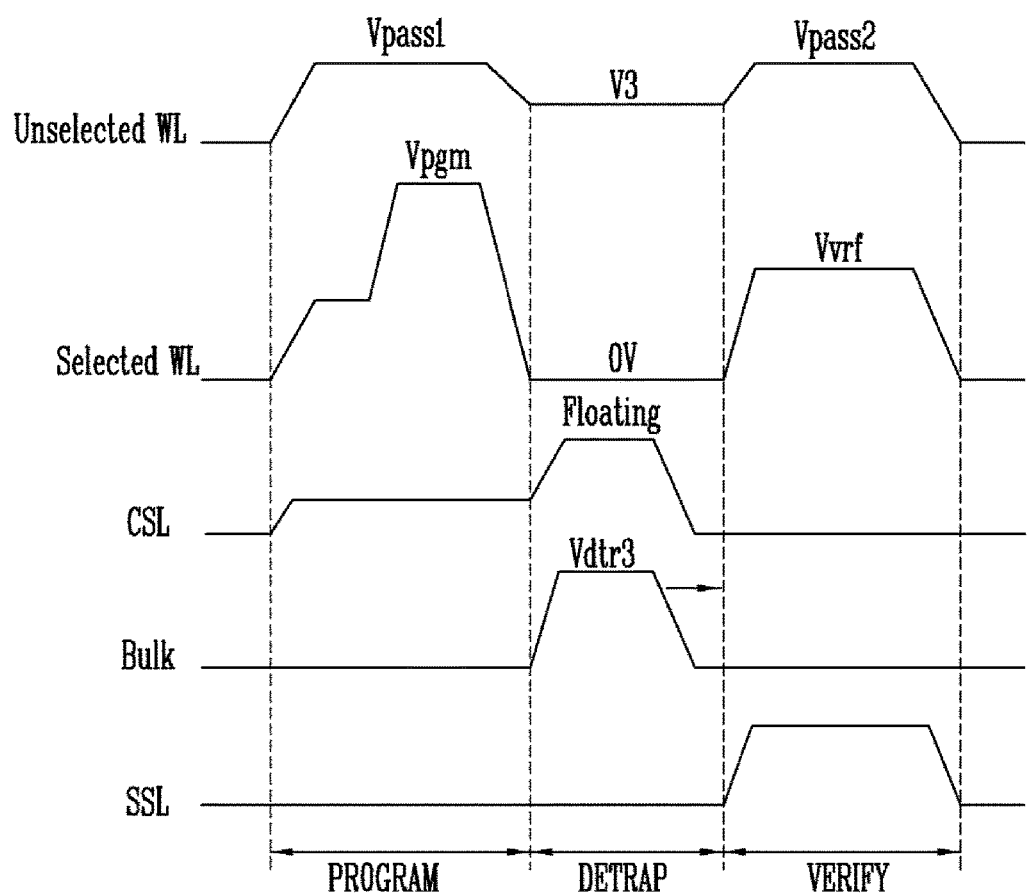
FIG. 13 shows a timing diagram illustrating an operation method of a semiconductor memory device according to an embodiment of the present disclosure.

FIG. 13 shows a timing diagram illustrating another embodiment of the operation method of the semiconductor memory device 100 according to the present disclosure.

Referring to FIG. 13, the ground voltage is supplied to the bit line BL1 to store data during the program section PROGRAM. Meanwhile, the program voltage Vpgm is supplied to the word line WLi (selected WL as illustrated) coupled to the selected memory cell MCi, and the program pass voltage Vpass1 is supplied to the word lines WL1 to WLi−1 and WLi+1 to WLn (unselected WL as illustrated) coupled to the unselected memory cells MC1 to MCi−1 and MCi+1 to MCn. In addition, similar to FIG. 8, a voltage slightly higher than the ground voltage may be applied to the common source line CSL. This is provided to reduce a rapid increase of the potential of the common source line CSL during the detrap section DETRAP. The drain select transistor DST may be turned on as the power voltage is provided to the drain select line DSL1. Meanwhile, the ground voltage may be supplied to the bulk region BULK.

The operation of the program section PROGRAM shown in FIG. 13 is similar to that of the program section PROGRAM shown in FIG. 8.

During the detrap section DETRAP, the detrap voltage is applied to the cell string CS11. To this end, the bias controller 130 shown in FIG. 1 applies a detrap voltage to the cell string CS11 including the memory cell MCi. More specifically, in an embodiment represented by FIG. 13, a detrap voltage Vdtr3 is applied to the bulk region BULK in which the cell string CS11 is formed. The detrap voltage Vdtr3 may be applied throughout the entire detrap section DETRAP, or it may be applied during only a partial period in the detrap section DETRAP. Meanwhile, the common source line coupled to the cell string CS11 is floated during the detrap section DETRAP.

As the voltage of the bulk region BULK is increased, the voltage of the common source line CSL is also increased due to a coupling phenomenon. As the voltage of the common source line CSL is increased, a current caused by the GIDL phenomenon is generated in the channel region of the source select transistor SST of the cell string CS11. Accordingly, holes are injected into the channel region of the cell string CS11. Thus, the channel potential of the cell string CS11 is increased. Alternatively, as the voltage of the bulk region BULK is increased, holes may be directly supplied to the channel region of the cell string CS11 from the bulk region. According to this process, the channel potential of the cell string CS11 is increased.

Meanwhile, in an embodiment, a ground voltage, i.e., a voltage of 0V, may be applied to the word line WLi coupled to the selected memory cell MCi during the detrap section DETRAP. The ground voltage (0V) applied to the word line WLi coupled to the selected memory cell MCi is illustrative of some embodiments. In other embodiments, different voltages may be applied to the word line WLi coupled to the selected memory cell MCi. The electrons of the region 235 (see FIG. 6) of the selected memory cell MCi may be removed due to a difference in potential between the channel region of the selected memory cell MCi and the word line WLi coupled to the selected memory cell MCi. Specifically, holes injected into the channel region may be injected into the region 235 of the selected memory cell MCi by the GIDL current. The voltage applied to the word line WLi of the selected memory cell MCi during the detrap section DETRAP may take on various values, if necessary. As the voltage applied to the word line WLi becomes smaller, a larger number of electrons may be trapped in the region 235 of FIG. 6. However, when the voltage applied to the word line WLi is excessively small, even the electrons trapped in the region 231 of FIG. 6 are detrapped, and therefore, a program period may be increased. When the voltage applied to the word line WLi is excessively large, the difference in potential between the word line WLi and the channel region is decreased, and therefore, the detrapping of the electrons trapped in the region 231 of FIG. 6 is not performed well.

In order to inject holes injected into the channel region into the region 235 of FIG. 6, the voltage applied to the word line WLi of the selected memory cell MCi has a voltage smaller than the detrap voltage Vdtr3. Meanwhile, the ground voltage may be applied to the source select line SSL and the drain select line DSL1 during the detrap section DETRAP.

According to the detrap operation of the detrap section DETRAP shown in FIG. 13, a detrapping effect occurs as shown in FIG. 10. The detrap voltage Vdtr3 is applied to the bulk region BULK during the detrap section DETRAP, and accordingly, the voltage of the common source line CSL is increased. As the voltage of the common source line CSL is increased, holes are injected into the channel region of the cell string CS11 so that the channel potential of the cell string CS11 is increased. Meanwhile, the channel potential of the cell string CS11 may be increased by holes directly supplied to the channel region of the cell string CS11 from the bulk region, in addition to the GIDL current.

Meanwhile, because the ground voltage is applied to the word line WLi coupled to the selected memory cell MCi, some 237 of the holes injected into the channel region of the cell string CS11 are injected in the direction of the tunnel insulating layer region 220 from the channel region 210. Because the holes are injected into the tunnel insulating layer region 220, electrons existing in the tunnel insulating layer region 220 or electrons shallowly trapped in the charge storage layer region 230 are removed. Accordingly, it is possible to reduce a threshold voltage drop phenomenon after the program operation is completed, and thus, the program reliability of the semiconductor memory device can be improved.

The detrap operation is not performed on the memory cells MC1 to MCi−1 and MCi+1 to MCn, only on the selected memory cell MCi being programmed. Therefore, in an embodiment, a detrap pass voltage V3 higher than the ground voltage (0V) is applied to the word lines WL1 to WLi−1 and WLi+1 to WLn coupled to gate terminals of the unselected memory cells MC1 to MCi−1 and MCi+1 to MCn during the detrap section DETRAP. The detrap pass voltage V3 is a voltage selected so that detrap does not occur in the unselected memory cells MC1 to MCi−1 and MCi+1 to MCn. That is, since the detrap pass voltage V3 has a voltage value higher than that of the voltage applied to the word line WLi, the holes injected into the channel region have no influence on threshold voltages of the unselected memory cells MC1 to MCi−1 and MCi+1 to MCn. To this end, the detrap pass voltage V3 applied to the unselected memory cells MC1 to MCi−1 and MCi+1 to MCn during the detrap section DETRAP is larger than the voltage (e.g., the ground voltage) applied to the selected word line WLi. In another embodiment, the word lines WL1 to WLi−1 and WLi+1 to WLn coupled to the gate terminals of the unselected memory cells MC1 to MCi−1 and MCi+1 to MCn may be floated during the detrap section DETRAP.

In the verify section VERIFY, a verify voltage Vvrf is applied to the word line WLi coupled to the selected memory cell MCi to determine whether the threshold voltage of the selected memory cell MCi has been increased to a target state. The operation of the cell string CS11 during the verify section VERIFY is identical to that described with reference to FIGS. 8 and 9. Therefore, the description is not repeated here.

As described above, for the semiconductor memory device 100 according to an embodiment of the present disclosure, as the detrap section DETRAP is provided between the program section PROGRAM and the verify section VERIFY, the injection of holes, caused by the GIDL phenomenon, occurs in the channel region of the cell string during the detrap section DETRAP. More specifically, according to an embodiment represented by FIG. 13, the bias controller 130 allows the voltage of the bulk region BULK in which the cell string CS11 is formed to be increased so that the voltage of the common source line CSL is increased. Accordingly, the injection of holes occurs in the channel region adjacent to the source select transistor SST of the cell string CS11. In addition, holes can be directly supplied to the channel region of the cell string CS11 from the bulk region. Thus, the channel potential is increased by the holes supplied to the channel region. Some of the holes introduced into the channel region are injected into the tunnel insulating layer region of the selected memory cell MCi due to a difference in potential between the channel region and the word line WLi. Consequently, as electrons remaining in the tunnel insulating region of the selected memory cell MCi or electrons shallowly trapped in the charge storage layer region are removed, a change in the threshold voltage of the selected memory cell MCi is minimized after the program operation is completed. As a result, the operational reliability of the semiconductor memory device 100 is improved.

Because the bias controller 130 controls the voltage of the common source line CSL or the voltage of the bit line BL1, the methods described with reference to FIGS. 8 to 12 can be applied to both of the memory cell array structures shown in FIGS. 3 and 4. However, because the bias controller 130 controls the voltage of the bulk region BULK in which the cell string is formed, it may be difficult to apply the method described with reference to FIG. 13 to the memory cell array structure shown in FIG. 3, which includes the pipe transistor PT.

Figure 14:
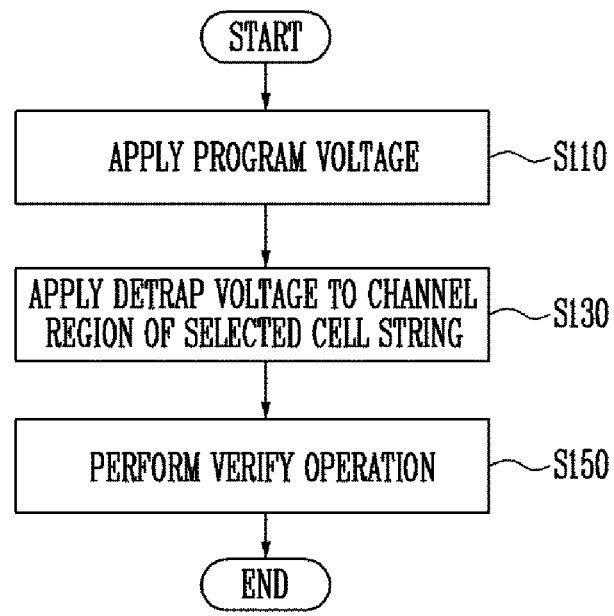
FIG. 14 shows a flowchart illustrating an operation method of a semiconductor memory device according to an embodiment of the present disclosure.

FIG. 14 shows a flowchart illustrating an operation method of the semiconductor memory device 100 according to an embodiment of the present disclosure.

Referring to FIG. 14, the operation method includes the semiconductor memory device 100 applying S110 a program voltage to a selected memory cell, applying S130 a detrap voltage to a channel region of a selected cell string, and performing S150 a verify operation on the selected memory cell.

Applying S110 the program voltage to the selected memory cell may correspond to the operation performed during the program section PROGRAM of FIGS. 8, 11, and 13. That is, the program voltage Vpgm is applied to the word line WLi coupled to the selected memory cell MCi so that the threshold voltage of the selected memory cell MCi is increased. The program pass voltage Vpass1 is applied to the word lines WL1 to WLi−1 and WLi+1 to WLn coupled to the unselected memory cells MC1 to MCi−1 and MCi+1 to MCn.

Applying S130 the detrap voltage to the channel region of the selected cell string may correspond to the operation performed during the detrap section DETRAP of FIGS. 8, 11, and 13. That is, holes are injected into the channel region of the cell string CS11 so that the channel potential of the cell string CS11 is increased. In addition, the ground voltage, e.g., the voltage of 0V, is applied to the word line WLi coupled to the selected memory cell MCi so that the detrap operation is performed. Meanwhile, the detrap pass voltage V1, V2, or V3 is applied to the word lines WL1 to WLi−1 and WLi+1 to WLn coupled to the unselected memory cells MC1 to MCi−1 and MCi+1 to MCn so that the detrap operation is not performed on the unselected memory cells MC1 to MCi−1 and MCi+1 to MCn.

Performing S150 the verify operation on the selected memory cell may correspond to the operation performed during the verify section VERIFY of FIGS. 8, 11, and 13. In performing S150 the verify operation on the selected memory cell, the program verify voltage Vvrf is applied to the word line WLi coupled to the selected memory cell MCi so that the verify operation is performed on the selected memory cell MCi. The verify pass voltage Vpass2 is applied to the word lines WL1 to WLi−1 and WLi+1 to WLn coupled to the unselected memory cells MC1 to MCi−1 and MCi+1 to MCn.

Applying S110 the program voltage to the selected memory cell, applying S130 the detrap voltage to the channel region of the selected cell string, and performing S150 the verify operation on the selected memory cell may constitute a program loop. As the program loop is repeatedly performed, the program operation is performed on the selected memory cell.

Figure 15:
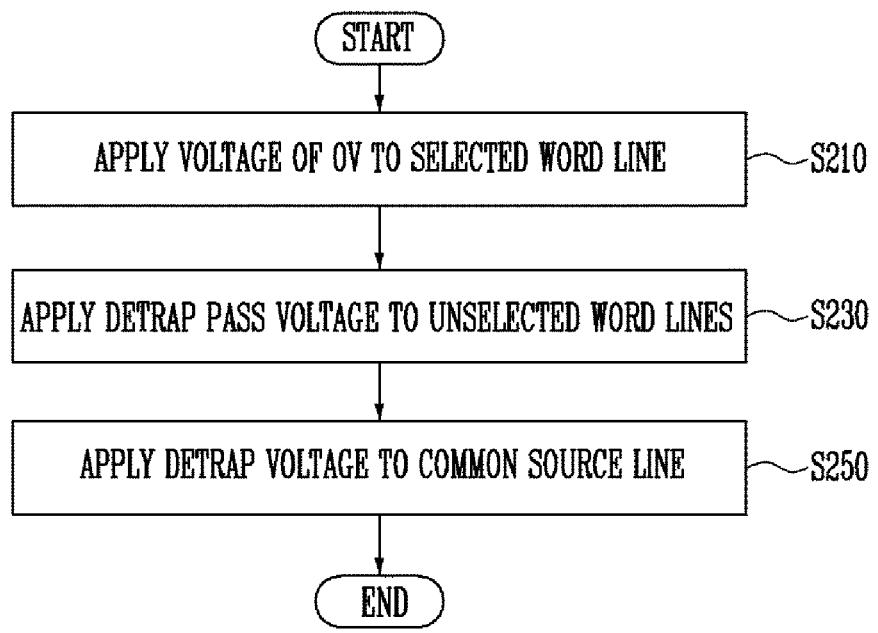
FIG. 15 shows a flowchart illustrating in detail a first example of applying a detrap voltage, which is shown in FIG. 14.

FIG. 15 shows a flowchart illustrating in more detail an example of the operation of applying the detrap voltage indicated in FIG. 14. More specifically, FIG. 15 shows a flowchart illustrating the detrap operation described with reference to FIGS. 8 and 9.

Referring to FIG. 15, during the detrap section DETRAP, a voltage of 0V is applied S210 to the selected word line WLi. However, this is illustrative, and other voltages that may allow a detrap phenomenon to occur may be applied to the selected word line WLi in different embodiments. Meanwhile, a detrap pass voltage is applied S230 to the unselected word lines WL1 to WLi−1 and WLi+1 to WLn. The detrap pass voltage may be the voltage V1 shown in FIG. 8. In addition, a detrap voltage Vdtr1 is applied S250 to the common source line CSL of the cell string CS11 by the bias controller 130. According to the detrap operation shown in FIG. 15, holes are injected into the channel region of the cell string CS11, and the channel potential of the cell string CS11 is increased. Due to a difference in potential between the channel region and the word line WLi, some of the holes of the channel region are injected in the direction of the tunnel insulating layer region 220 from the channel region 210 of the selected memory cell MCi. Accordingly, as electrons existing in the tunnel insulating region 220 or electrons shallowly trapped in the charge storage layer region 230 are removed, the threshold voltage of the selected memory cell MCi is stably maintained. As a result, the operational reliability of the semiconductor memory device 100 is improved.

Figure 16:
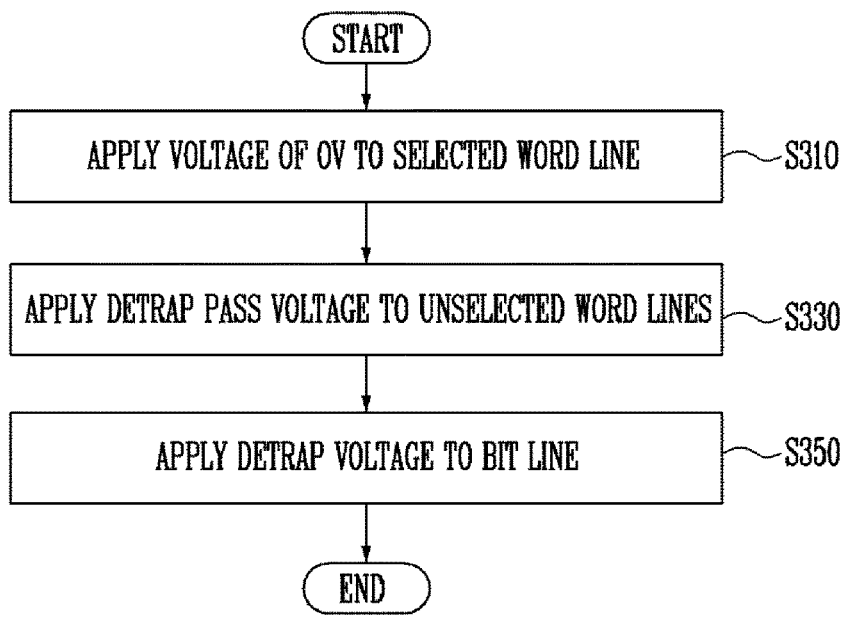
FIG. 16 shows a flowchart illustrating in detail a second example of applying a detrap voltage, which is shown in FIG. 14.

FIG. 16 shows a flowchart illustrating in more detail another example of the step of applying the detrap voltage, which is shown in FIG. 14. More specifically, FIG. 16 shows a flowchart illustrating the detrap operation described with reference to FIGS. 11 and 12.

Referring to FIG. 16, during the detrap section DETRAP, a voltage of 0V is applied S310 to the selected word line WLi. However, this is illustrative of some embodiments. In different embodiments, other voltages that may allow a detrap phenomenon to occur can be applied to the selected word line WLi. Meanwhile, a detrap pass voltage is applied S330 to the unselected word lines WL1 to WLi−1 and WLi+1 to WLn. The detrap pass voltage may be the voltage V2 shown in FIG. 11. In addition, a detrap voltage Vdtr2 is applied S350 to the bit line BL1 coupled to the cell string CS11 by the bias controller 130. According to the detrap operation shown in FIG. 16, holes are injected into the channel region of the cell string CS11, and the channel potential of the cell string CS11 is increased. Due to a difference in potential between the channel region and the word line WLi, some of the holes of the channel region are injected in the direction of the tunnel insulating layer region 220 from the channel region 210 of the selected memory cell MCi. Accordingly, as electrons existing in the tunnel insulating region 220 or electrons shallowly trapped in the charge storage layer region 230 are removed, the threshold voltage of the selected memory cell MCi is stably maintained. As a result, the operational reliability of the semiconductor memory device 100 is improved.

Figure 17:
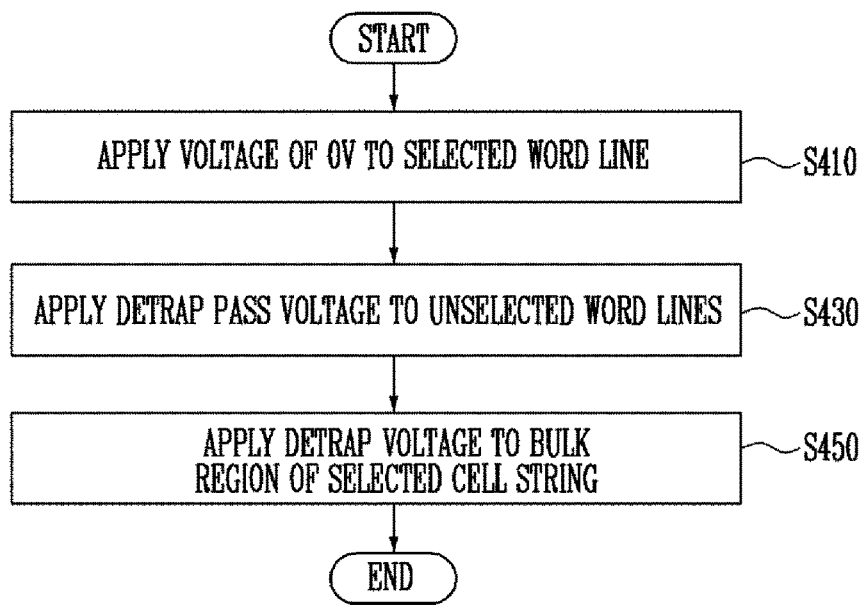
FIG. 17 shows a flowchart illustrating in detail a third example of applying a detrap voltage, which is shown in FIG. 14.

FIG. 17 shows a flowchart illustrating in more detail still another example of the step of applying the detrap voltage, which is shown in FIG. 14. More specifically, FIG. 17 is a flowchart illustrating the detrap operation described with reference to FIG. 13.

Referring to FIG. 17, during the detrap section DETRAP, a voltage of 0V is applied S410 to the selected word line WLi. However, this is illustrative of some embodiments. In other embodiments, different voltages that may allow a detrap phenomenon to occur can be applied to the selected word line WLi. Meanwhile, a detrap pass voltage is applied S430 to the unselected word lines WL1 to WLi−1 and WLi+1 to WLn. The detrap pass voltage may be the voltage V3 shown in FIG. 13. In addition, a detrap voltage Vdtr3 is applied S450 by the bias controller 130 to the bulk region BULK in which the cell string CS11 is formed. In some cases, the common source line CSL coupled to the cell string CS11 may be floated. Accordingly, the voltage of the common source line CSL is increased due to a coupling phenomenon. According to the detrap operation shown in FIG. 17, holes are injected into the channel region of the cell string CS11. Alternatively, holes may be directly supplied to the channel region of the cell string CS11 from the bulk region BULK. The channel potential of the cell string CS11 is increased by the holes supplied to the channel region. Due to a difference in potential between the channel region and the word line WLi, some of the holes of the channel region are injected in the direction of the tunnel insulating layer region 220 of the selected memory cell MCi. Accordingly, as electrons existing in the tunnel insulating region 220 or electrons shallowly trapped in the charge storage layer region 230 are removed, the threshold voltage of the selected memory cell MCi is stably maintained. As a result, the operational reliability of the semiconductor memory device 100 is improved.

As described above, the detrap operations described with reference to FIGS. 15 and 16 can be applied to both of the memory cell array structures shown in FIGS. 3 and 4. However, the detrap operation described with reference to FIG. 17 can be applied to the memory cell array structure shown in FIG. 4, but it may be difficult to apply the detrap operation described with reference to FIG. 17 to the memory cell array structure shown in FIG. 3.

Figure 18:
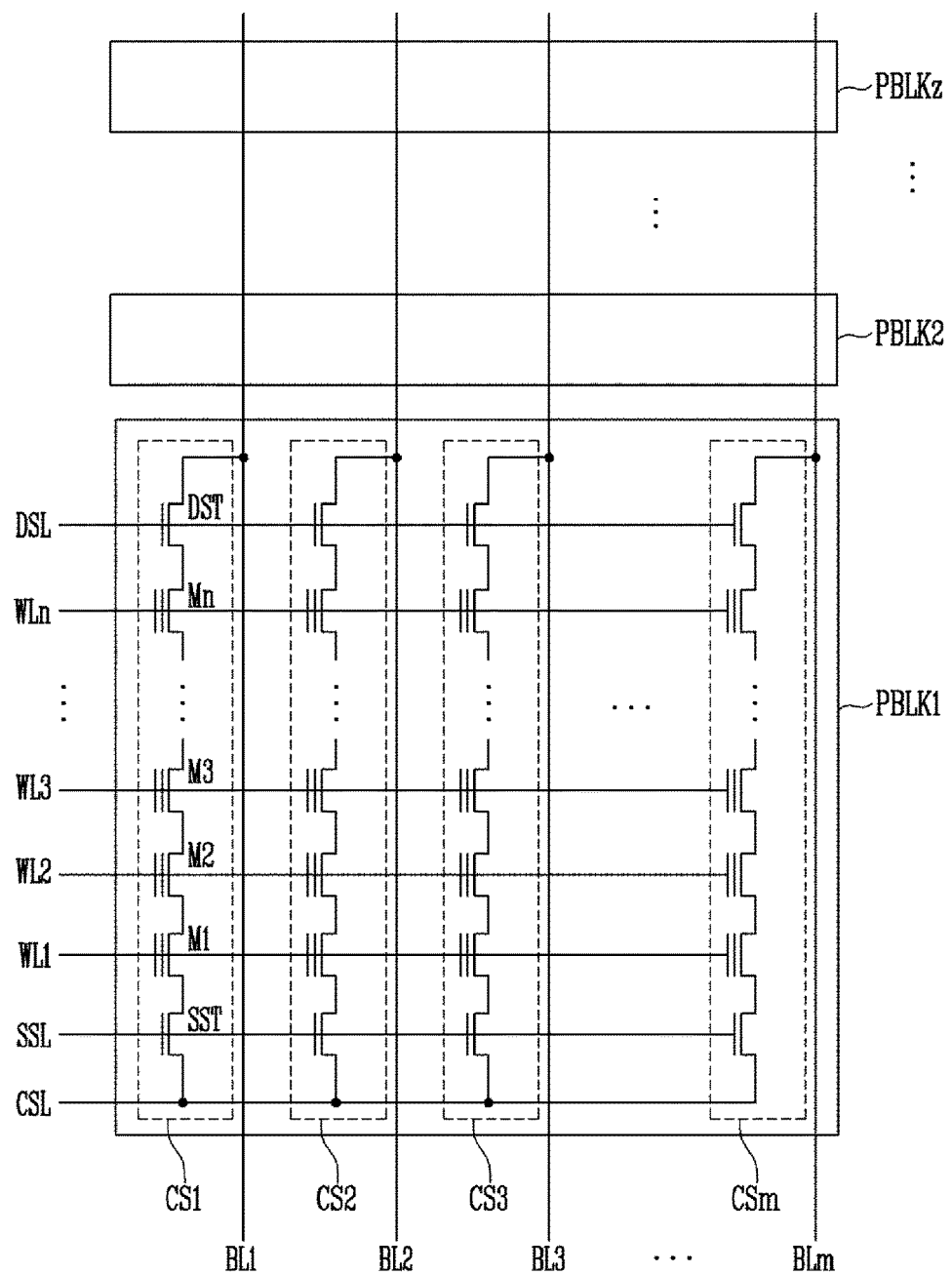
FIG. 18 shows a block diagram illustrating an embodiment of the memory cell array of FIG. 1.

FIG. 18 shows a block diagram illustrating another embodiment of the memory cell array 110 of FIG. 1.

The technical spirit of the present disclosure may be applied even when memory cells are two-dimensionally arranged. Referring to FIG. 18, the memory cell array 110 includes a plurality of planar memory blocks PBLK1 to PBLKz. Each of the plurality of planar memory blocks PBLK1 to PBLKz includes first to mth cell strings CS1 to CSm. The first to mth cell strings CS1 to CSm are coupled to first to mth bit lines BL1 to BLm, respectively.

Each of the plurality of cell strings CS1 to CSm includes a source select transistor SST, a plurality of memory cells M1 to Mn coupled in series, and a drain select transistor DST. The source select transistor SST is coupled to a source select line SSL. The first to nth memory cells M1 to Mn are coupled to first to nth word lines WL1 to WLn, respectively. The drain select transistor DST is coupled to a drain select line DSL. A source side of the source select transistor SST is coupled to a common source line CSL. A drain side of the drain select transistor DST is coupled to a corresponding bit line, as illustrated. The source select line SSL, the first to nth word lines WL1 to WLn, and the drain select line DSL are included in the row lines RL of FIG. 1. The source select line SSL, the first to nth word lines WL1 to WLn, and the drain select line DSL are driven by the address decoder 120. The common source line CSL is driven by the bias controller 130.

Figure 19:
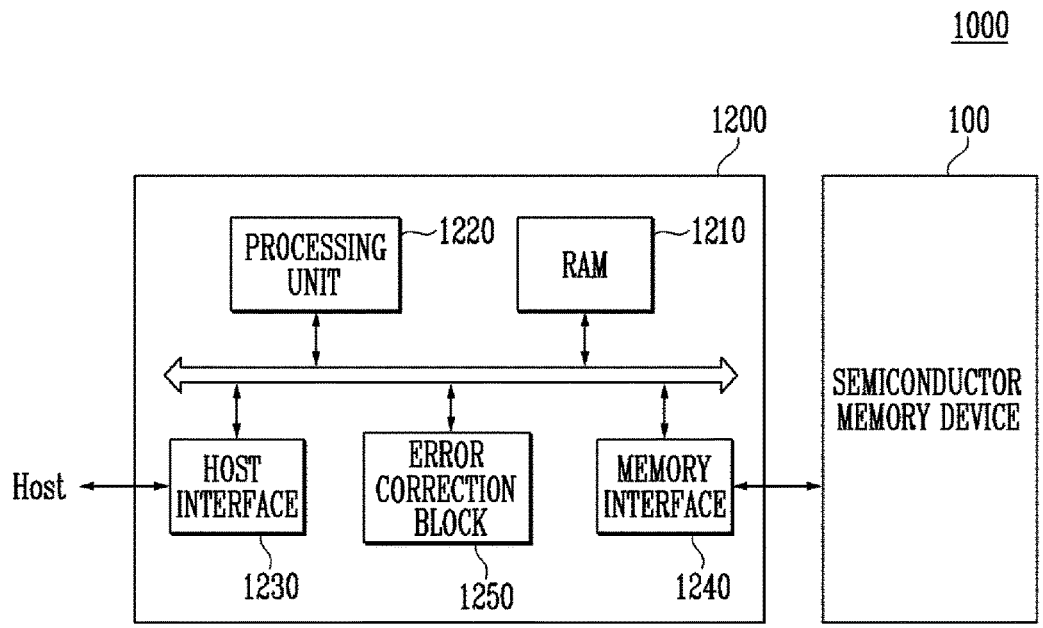
FIG. 19 shows a block diagram illustrating a memory system including the semiconductor memory device of FIG. 1.

FIG. 19 shows a block diagram illustrating a memory system 1000 including the semiconductor memory device 100 of FIG. 1.

Referring to FIG. 19, the memory system 1000 includes the semiconductor memory device 100 and a controller 1200.

The semiconductor memory device 100 may be configured and operated as described with reference to FIGS. 1 to 18. Descriptions already presented above will be omitted below.

The controller 1200 is coupled to a host Host and the semiconductor memory device 100. The controller 1200 is configured to access the semiconductor memory device 100 in response to a request from the host Host. For example, the controller 1200 is configured to control read, write, erase, and background operations of the semiconductor memory device 100. The controller 1200 is configured to provide an interface between the semiconductor memory device 100 and the host Host. The controller 1200 is configured to drive firmware for controlling the semiconductor memory device 100.

The controller 1200 includes random access memory (RAM) 1210, a processing unit 1220, a host interface 1230, a memory interface 1240, and an error correction block 1250. The RAM 1210 is used as at least one of an operation memory of the processing unit 1220, a cache memory between the semiconductor memory device 100 and the host Host, and/or a buffer memory between the semiconductor memory device 100 and the host Host. The processing unit 1220 controls overall operations of the controller 1200.

The host interface 1230 includes a protocol for exchanging data between the host Host and the controller 1200. In an embodiment, the controller 1200 is configured to communicate with the host Host through at least one of various interface protocols. Such protocols can include, for example, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 100. For example, the memory interface 1240 may include a NAND interface or a NOR interface.

The error correction block 1250 is configured to detect and correct an error in data received from the semiconductor memory device 100 by using an error correction code (ECC).

The controller 1200 and the semiconductor memory device 100 may be collocated or integrated into a single semiconductor device. In an embodiment, the controller 1200 and the semiconductor memory device 100 may be integrated into one semiconductor device, to constitute a memory card. For example, the controller 1200 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

For an embodiment, the controller 1200 and the semiconductor memory device 100 may be integrated into a single semiconductor device constituting a semiconductor drive (i.e., a solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In some embodiments, the semiconductor memory device 100 or the memory system 1000 may be packaged in various forms. For example, the semiconductor memory device 100 and/or the memory system 1000 may be packaged as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 20:
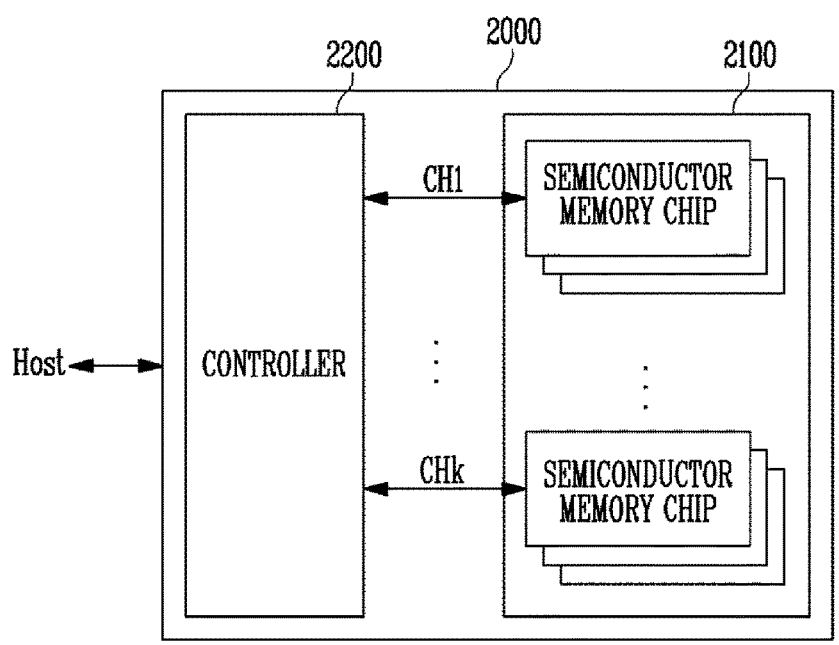
FIG. 20 shows a block diagram illustrating an application of the memory system of FIG. 19.

FIG. 20 shows a block diagram illustrating an application example 2000 of the memory system 1000 of FIG. 19.

Referring to FIG. 20, the memory system 2000 includes a semiconductor memory device 2100 and a controller 2200. The semiconductor memory device 2100 includes a plurality of semiconductor memory chips. The plurality of semiconductor memory chips are divided into a plurality of groups.

FIG. 20 shows that the plurality of groups of semiconductor memory chips communicate with the controller 2200 through first to kth channels CH1 to CHk. Each semiconductor memory chip may be configured and operated identically to the semiconductor memory device 100 described with reference to FIG. 1.

Each group of semiconductor memory chips is configured to communicate with the controller 2200 through one common channel. The controller 2200 is configured similarly to the controller 1200 described with reference to FIG. 19. The controller 2200 is configured to control the plurality of memory chips of the semiconductor memory device 2100 through the plurality of channels CH1 to CHk.

FIG. 20 illustrates that each plurality of semiconductor memory chips is coupled to a single channel. However, it will be understood that the memory system 2000 may be modified so that one semiconductor memory chip is coupled to one channel.

Figure 21:
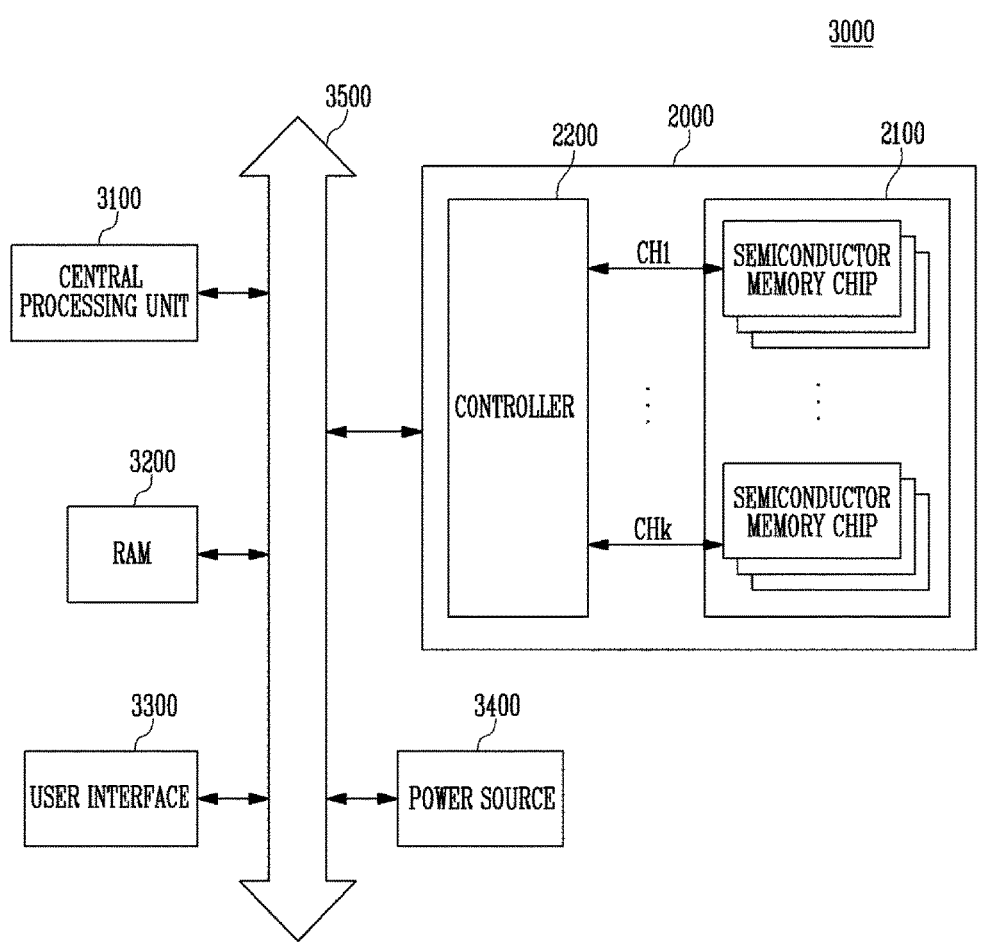
FIG. 21 shows a block diagram illustrating a computing system including the memory system described with reference to FIG. 20.

FIG. 21 shows a block diagram illustrating a computing system 3000 including the memory system 2000 described with reference to FIG. 20.

Referring to FIG. 21, the computing system 3000 includes a central processing unit 3100, RAM 3200, a user interface 3300, a power source 3400, a system bus 3500, and the memory system 2000.

The memory system 2000 is electrically coupled to the central processing unit 3100, the RAM 3200, the user interface 3300, and the power source 3400 through the system bus 3500. Data supplied through the user interface 3300 or data processed by the central processing unit 3100 are stored in the memory system 2000.

FIG. 21 illustrates that the semiconductor memory device 2100 is coupled to the system bus 3500 through the controller 2200. However, in another embodiment, the semiconductor memory device 2100 may be directly coupled to the system bus 3500. In this case, the function of the controller 2200 may be performed by the central processing unit 3100 and the RAM 3200.

FIG. 21 shows that the computing system 3000 includes the memory system 2000 described with reference to FIG. 20. In another embodiment, the computing system 3000 may instead include the memory system 1000 described with reference to FIG. 19. In a different embodiment, the computing system 3000 may be configured to include both the memory systems 1000 and 2000 described with reference to FIGS. 19 and 20.

According to the present disclosure, it is possible to provide a semiconductor memory device in which the reliability of a program operation is improved.

Further, according to the present disclosure, it is possible to provide a method for performing a program operation having improved reliability on a semiconductor memory device.

Example embodiments have been disclosed herein. Although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and detail may be made to presented embodiments without departing from the spirit and scope of the present disclosure as set forth by the following claims.

What is claimed is:

1. A semiconductor memory device comprising:
a cell string including a plurality of memory cells coupled between a common source line and a bit line; and
a peripheral circuit configured to control a voltage supplied to the cell string such that a selected memory cell of the plurality of memory cells of the cell string is programmed by performing a program loop including a program section, a detrap section, and a verify section,
wherein the peripheral circuit is further configured to supply a program voltage to a word line coupled to the selected memory cell during the program section, supply a detrap voltage to the cell string during the detrap section, and supply a verify voltage to the word line during the verify section.

2. The semiconductor memory device of claim 1, wherein the peripheral circuit comprises:
an address decoder configured to transfer the program voltage and the verify voltage to the word line coupled to the selected memory cell by decoding a row address;
a bias controller configured to supply, during the detrap section, the detrap voltage to increase a channel potential of the cell string; and
a read/write circuit coupled to the bit line of the cell string, wherein the read/write circuit is configured to transfer data to be programmed to the cell string.

3. The semiconductor memory device of claim 2, wherein the bias controller is coupled to the common source line, and wherein the bias controller supplies, during the detrap section, the detrap voltage to the common source line to increase a channel potential of the selected memory cell.

4. The semiconductor memory device of claim 3, wherein, during the detrap section, the address decoder supplies a first voltage to the word line coupled to the selected memory cell and supplies a detrap pass voltage to a word line coupled to an unselected memory cell of the plurality of the memory cells,
wherein the first voltage is smaller than the detrap voltage, and the detrap pass voltage is larger than the first voltage.

5. The semiconductor memory device of claim 2, wherein the bias controller is coupled to the bit line, and wherein the bias controller supplies the detrap voltage to the bit line during the detrap section to increase the channel potential of the selected memory cell.

6. The semiconductor memory device of claim 5, wherein, during the detrap section, the address decoder supplies a first voltage to the word line coupled to the selected memory cell and supplies a detrap pass voltage to a word line coupled to an unselected memory cell of the plurality of memory cells,
wherein the first voltage is smaller than the detrap voltage, and the detrap pass voltage is larger than the first voltage.

7. The semiconductor memory device of claim 2, wherein the bias controller supplies, during the detrap section to increase the channel potential of the selected memory cell, the detrap voltage to a bulk region in which the cell string is formed.

8. The semiconductor memory device of claim 7, wherein the common source line is floated and, as a potential of the bulk region is increased, holes are supplied to a channel region of the cell string so that the channel potential is increased.

9. The semiconductor memory device of claim 7, wherein, during the detrap section, the address decoder supplies a first voltage to the word line coupled to the selected memory cell and supplies a detrap pass voltage to a word line coupled to an unselected memory cell of the plurality of memory cells,
wherein the first voltage is smaller than the detrap voltage, and the detrap pass voltage is larger than the first voltage.

10. The semiconductor memory device of claim 1, wherein the detrap voltage is a voltage that results in holes being injected into the channel region of the cell string to remove electrons trapped in a tunnel insulating layer region of the selected memory cell.

11. The semiconductor memory device of claim 1, wherein the detrap voltage is a voltage that results in holes being injected into the channel region of the cell string to remove electrons trapped in a first region adjacent to the tunnel insulating layer in a charge storage layer region of the selected memory cell.

12. A method for operating a semiconductor memory device, the method comprising:
    applying a program voltage to a word line coupled to a selected memory cell of a plurality of memory cells included in a cell string of the semiconductor memory device;
    performing a detrap operation, using a detrap voltage, on the selected memory cell; and
    performing a verify operation on the selected memory cell.

13. The method of claim 12, wherein performing the detrap operation further comprises:
    applying the detrap voltage to the cell string to increase a potential of a channel region of the cell string.

14. The method of claim 13, wherein performing the detrap operation further comprises:
    applying the detrap voltage to a common source line of the cell string to increase a potential of a channel region of the selected memory cell.

15. The method of claim 13, wherein performing the detrap operation further comprises:
    applying the detrap voltage to a bit line coupled to the cell string to increase a potential of a channel region of the selected memory cell.

16. The method of claim 13, wherein performing the detrap operation further comprises:
    applying the detrap voltage to a bulk region in which the cell string is formed to increase a potential of a channel region of the selected memory cell.

17. The method of claim 16 further comprising:
    floating a common source line of the semiconductor memory device while the detrap voltage is being applied to the bulk region; and
    supplying holes to the channel region of the cell string as a potential of the bulk region is increased to increase a channel potential of the cell string.

18. The method of claim 13, wherein performing the detrap operation further comprises:
    supplying a first voltage to the word line coupled to the selected memory cell, wherein the first voltage is smaller than the detrap voltage; and
    supplying a detrap pass voltage to a word line coupled to an unselected memory cell of the plurality of memory cells, wherein the detrap pass voltage is larger than the first voltage.

19. The method of claim 18, wherein the detrap voltage and the first voltage are such that holes are supplied to a tunnel insulating layer region of the selected memory cell due to a difference between the detrap voltage and the first voltage.

20. The method of claim 18, wherein the detrap voltage and the detrap pass voltage are such that holes are not supplied to the tunnel insulating layer region of the selected memory cell due to a difference between the detrap voltage and the detrap pass voltage.

* * * * *